United States Patent [19]

Kumagai et al.

[11] Patent Number: 5,440,718
[45] Date of Patent: Aug. 8, 1995

[54] SINGLE SEMICONDUCTOR SUBSTRATE RAM DEVICE UTILIZING DATA COMPRESSING/EXPANDING MECHANISM IN A MULTI-MICROPROCESSOR ENVIRONMENT

[75] Inventors: Takehiko Kumagai, Tokyo; Takashi Kikuchi; Takao Okubo, both of Akishima; Yasuyuki Fuse, Koganei, all of Japan

[73] Assignees: Hitachi, Ltd.; Hitachi VLSI Engineering Corp., Tokyo, Japan

[21] Appl. No.: 308,848

[22] Filed: Sep. 19, 1994

Related U.S. Application Data

[63] Continuation of Ser. No. 129,016, Sep. 28, 1992, abandoned, which is a continuation of Ser. No. 585,864, Sep. 20, 1990, abandoned.

[30] Foreign Application Priority Data

Sep. 20, 1989 [JP] Japan .................. 1-243615

[51] Int. Cl.⁶ .............................................. G06F 12/00
[52] U.S. Cl. .............................. 395/481; 364/DIG. 1; 364/DIG. 2; 364/232.8; 364/244; 364/260.6; 395/164; 341/50
[58] Field of Search ... 364/200 MS File, 900 MS File; 395/425; 341/50

[56] References Cited

U.S. PATENT DOCUMENTS

| | | | |
|---|---|---|---|
| 4,386,416 | 5/1983 | Giltner et al. | 395/375 |
| 4,454,575 | 6/1984 | Bushaw et al. | 395/275 |
| 4,491,909 | 1/1985 | Shimizu | 395/425 |
| 4,626,824 | 12/1986 | Larson | 341/95 |
| 4,730,348 | 3/1988 | MacCrisken | 375/122 |
| 4,918,588 | 4/1990 | Barrett et al. | 395/600 |
| 4,937,681 | 6/1990 | Fujinawa et al. | 358/426 |
| 5,057,932 | 10/1991 | Lang | 358/335 |
| 5,129,061 | 7/1992 | Wang et al. | 395/200 |
| 5,210,851 | 5/1993 | Kato et al. | 395/425 |

FOREIGN PATENT DOCUMENTS 63-183699 8/1988 Japan .
63-204594 11/1988 Japan .

Primary Examiner—Glenn Gossage
Assistant Examiner—Matthew M. Kim
Attorney, Agent, or Firm—Fay, Sharpe, Beall, Fagan, Minnich & McKee

[57] ABSTRACT

Compressor/expander circuits which are built in a common semiconductor substrate along with a random access memory unit function so as to realize compression/expansion processes merely through the internal data transfer controls between the circuits and the random access memory unit as based on built-in control unit. This endows the temporary storage of data and the compression/expansion processes hereof with continuities, and achieves higher speeds for the compression/expansion processes.

48 Claims, 19 Drawing Sheets

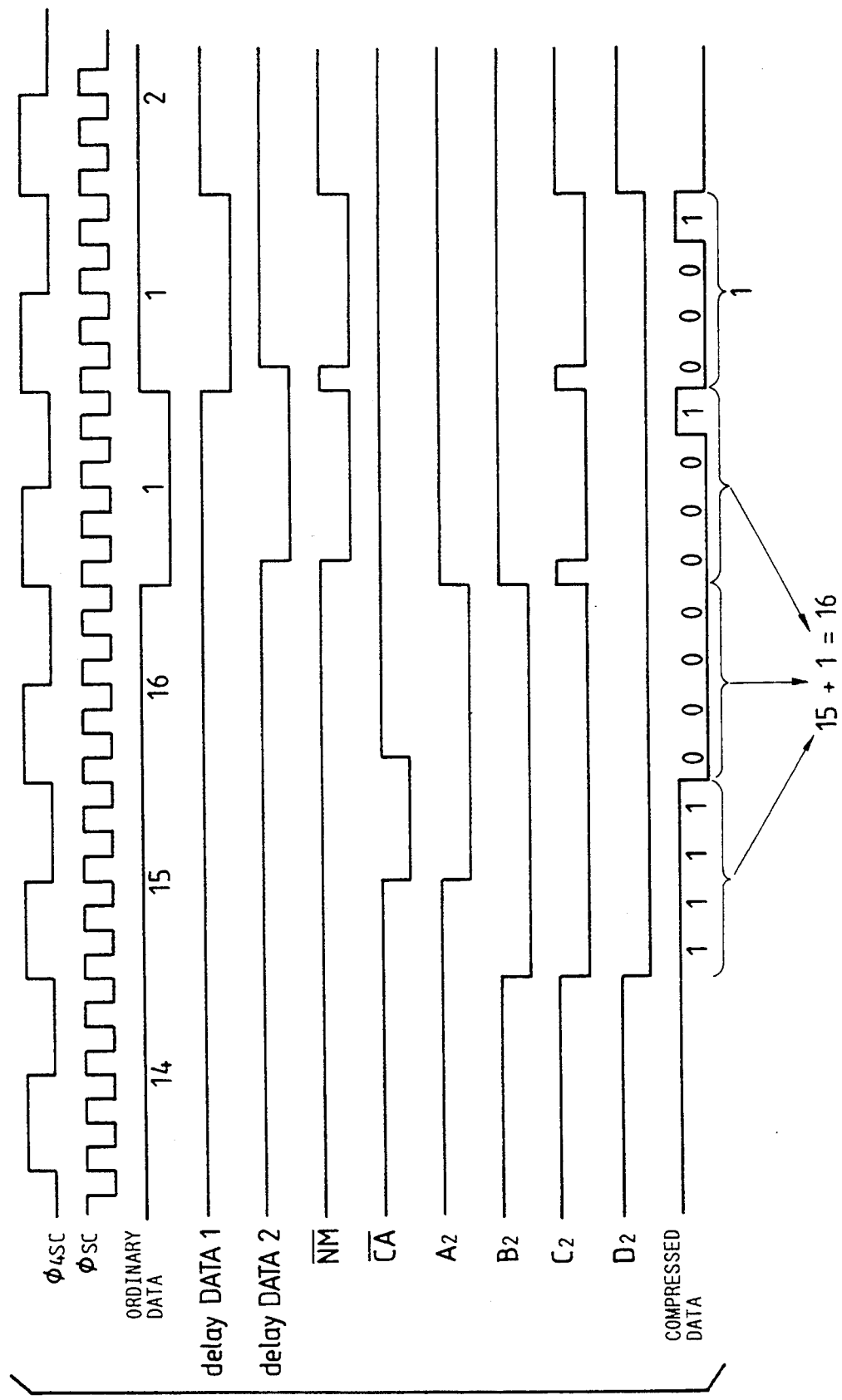

SINGLE SEMICONDUCTOR SUBSTRATE RAM DEVICE UTILIZING DATA COMPRESSING/EXPANDING MECHANISM IN A MULTI-MICROPROCESSOR ENVIRONMENT

This application is a continuation application of U.S. Ser. No. 08/129,016, filed Sep. 28, 1993, now abandoned, which was a continuation application of U.S. Ser. No. 07/585,864, filed Sep. 20, 1990, now abandoned.

BACKGROUND OF THE INVENTION

The present invention relates to a semiconductor memory device having multiple ports, and also to additional functions in the same. More particularly, it relates to techniques which are effective when applied to, for example, a buffer memory for communications data.

In communications, the quantity of pixel unit image information is considered large when compared with code information. It is therefore practiced in, for example, facsimile transmission that the quantity of information transmitted is compressed which shortens the data transmission time. A method for data compression is a one dimensional encoding method. This method encodes the information in blocks of pixels specified by binary information.

Where the data compression is done after temporarily storing the information to-be-encoded in a data buffer, the data buffer is accessed to read out the data and an encoding process for the compression is executed for the readout data through software or the like. This holds true also where the compressed data is expanded back into the original data. In other words, a conventional data buffer is not furnished with the functions of compressing/expanding data.

By the way, an example of publications stating the one-dimensional encoding method is "Microcomputer Handbook", pp. 1019–1020, issued by The Ohm-Sha, Ltd. on Dec. 25, 1985.

Besides, inventions for compressing data constructed on the same chip as that of a memory are disclosed in Japanese Patent Application Laid-open No. 63-183699 laid open on Jul. 29, 1988 in Japan and Japanese Patent Application Laid-open No. 63-204594 laid open on Aug. 24, 1988.

When the data buffer memory is not furnished with the data compressing/expanding functions as in the prior art, the temporary storage of the data and the process for compressing/expanding the data are inevitably separated, so that the data must be externally transferred between the data buffer memory and a compressing/expanding circuit. Moreover, when the compressing/expanding process is executed through the software, the burden on the processor is increased. The long time expended on the compressing/expanding process for the data temporarily stored, lowers the throughput of a system.

An object of the present invention is to provide a semiconductor memory device which can store data temporarily and which can execute processes for compressing/expanding data.

The above and other objects and novel features of the present invention will become apparent from the description of this specification when read in conjunction with the accompanying drawings.

SUMMARY OF THE INVENTION

Typical aspects of performance of the present invention are briefly summarized as follows:

A semiconductor memory device is constructed so as to comprise in a single semiconductor substrate, 1) a random access memory unit; 2) a device having multiple ports; 3) an input/output circuit unit which includes a data compressor circuit and a data expander circuit each connected to at least one of the multiple ports; and, 4) a controller for determining the operation modes of the random access memory unit and the input/output circuit unit in accordance with external control signals.

The device will permit at least one of the ports to transfer compressed data to and from the exterior of the semiconductor memory device in a case where the random access memory unit is utilized as an area for temporarily storing data that is not compressed. The operation modes of 1) compressing the data read out of the random access memory unit and then serially outputting the compressed data to the exterior, and 2) expanding the data supplied from the exterior and then writing the resulting data into the random access memory unit, may be included in the operation modes which the controller determines.

In addition, the device will permit at least one of the ports to transfer ordinary data in an uncompressed state to and from the exterior of the semiconductor memory device in a case where the random access memory unit is utilized as an area for temporarily storing compressed data. The operation modes of 1) expanding the data read out of the random access memory unit and then outputting the resulting data to the exterior, and 2) compressing the data supplied from the exterior and then writing the compressed data into the random access memory unit, may be included in the operation modes which the control means determines.

Besides, in a case of adopting the one-dimensional encoding method for the compression/expansion processes of data, it is desirable to connect the compressor circuit and the expander circuit to the serial access port of the random access memory unit beforehand. moreover, in case of considering the versatility of the operation of the whole system, any other port of the random access memory unit may be made a parallel access port which can be connected to a data bus.

Further, in order to increase the usefulness of the present invention, an operation mode in which data read out of the serial access port of the random access memory unit is output directly should preferably be included in the operation modes which the control means determines.

According to the expedients described above, the compressor circuit/expander circuit which are built in the common semiconductor substrate along with the random access memory unit, realize the processes merely through communication paths selected by the internal data transfer controls between the circuits and the random access memory unit as based on the built-in control means. This endows the temporary storage of data and the compression/expansion processes thereof with continuities, and achieves the higher speeds of the compression/expansion processes.

BRIEF DESCRIPTION OF THE DRAWINGS

FIGS. 15A through 15C are operation timing charts of the compressor circuit in FIG. 11;

DESCRIPTION OF THE PREFERRED EMBODIMENTS

Figure 1:
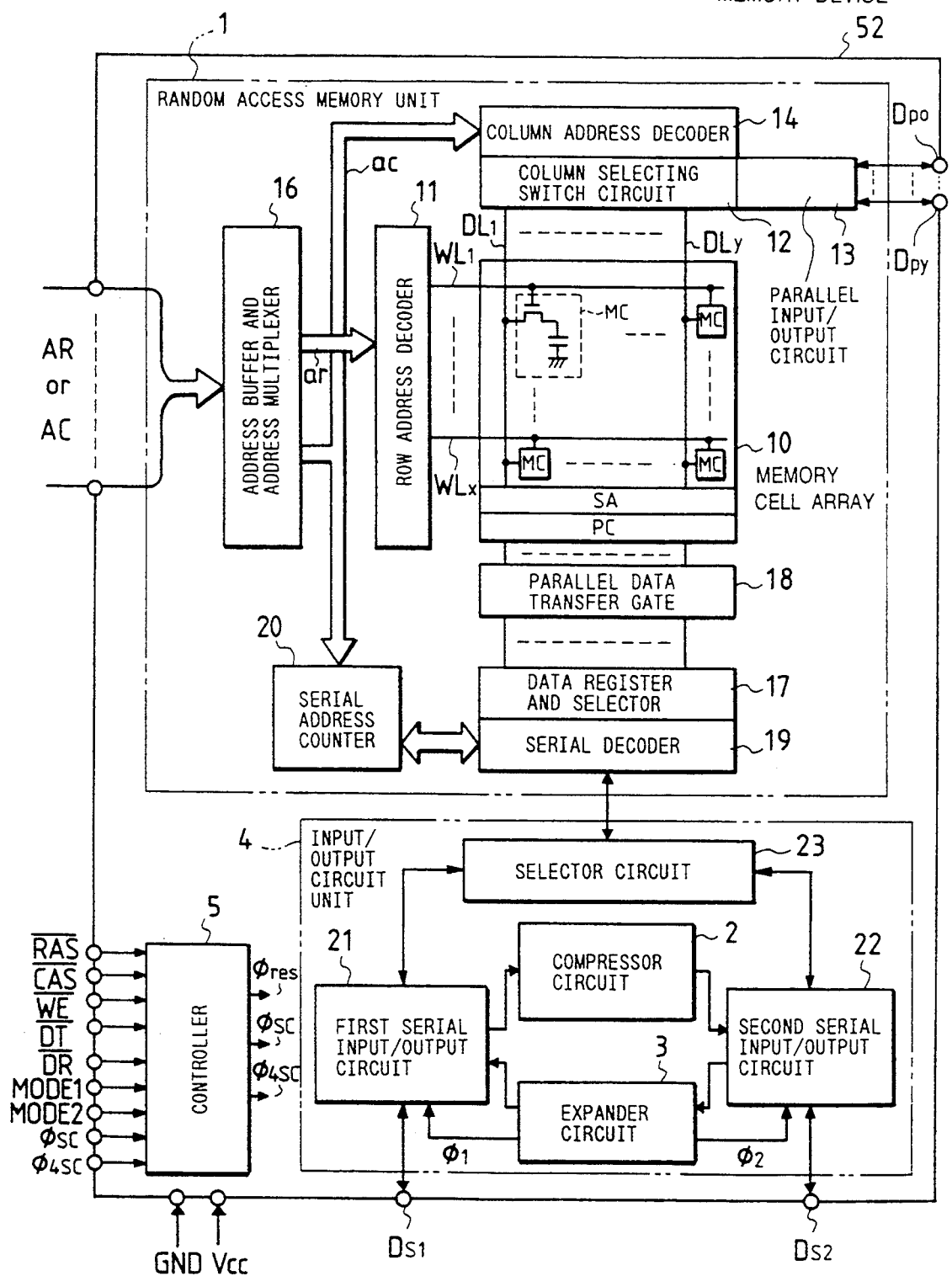
FIG. 1 is a block diagram of an embodiment of a semiconductor memory device according to the present invention.

Shown in FIG. 1 is an embodiment of a semiconductor memory device according to the present invention. The semiconductor memory device 52 of this embodiment is formed on a single semiconductor substrate such as silicon by known techniques for manufacturing semiconductor integrated circuits. It has two power source voltage terminals which are respectively supplied with a ground voltage GND and a voltage Vcc higher than the ground voltage, for operating various circuits within this memory device. As depicted in the figure, the semiconductor memory device 52 comprises: a random access memory unit 1 which has multiple ports; an input/output circuit unit 4 which includes a compressor circuit 2 and an expander circuit 3 and which is serial-interfaced with the random access memory unit 1 and the exterior of this memory device 52; and, a controller 5 which performs internal timing controls and mode setting controls.

Although not especially restricted thereto, the random access memory unit 1 has a construction similar to that of a frame buffer memory for picture data or a video RAM with two ports. It includes a memory cell array 10 in which a plurality of dynamic memory cells MC, each being configured of an address selecting MOSFET and an information storing capacitor, are arranged in the shape of a matrix. Numeral 11 indicates a row address decoder. This decoder selects one word line from among a plurality of word lines $WL_1$-$WL_x$. The selection terminals of the memory cells MC included in the memory cell array 10 are coupled at the respective rows thereof. A plurality of bit lines $DL_1$-$DL_y$ are coupled to the data input/output terminals of the memory cells MC at the respective columns thereof. They are also coupled on one side to sense amplifier SA as well as a precharge circuit PC. They are connected on the other side to parallel data external terminals $D_{p0}$-$D_{py}$ through a column selecting switch circuit 12 as well as a parallel input/output circuit 13. The column selecting switch circuit 12 is subjected to a switching control by the output signals of a column address decoder 14. Here, the parallel input/output circuit 13 is an example of a parallel access port for transferring parallel data, and it is utilized for random accesses.

In FIG. 1, numeral 16 denotes an address buffer and address multiplexer which is supplied with external address signals AR and AC respectively composed of a plurality of bits. It supplies internal row address signals ar to the row address decoder 11 in accordance with predetermined timings, and also supplies internal column address signals ac to the row address decoder 14 in accordance with predetermined timings.

As an example of a serial access port, the random access memory unit 1 has a data register and selector 17 which is connected to the bit lines $DL_1$-$DL_y$ and which is preceded by a parallel data transfer gate 18. The parallel data transfer gate 18 transfers data for one row read out of the memory cell array 10 to the data register and selector 17. This is accomplished during an internal data transfer cycle which is used alternatively to a random access cycle. The data register and selector 17 serially delivers the latched data as outputs in succession from a bit position previously determined for the bit array of the data. In addition, the data register and selector 17 latches serial data supplied from the input-/output circuit unit 4 and delivers the latched data to the bit lines $DL_1$-$DL_y$ through the parallel data transfer gate 18. That is, the data register and selector 17 performs the parallel/serial conversion of data between the memory cell array 10 and the input/output circuit unit 4.

Such input/output controls of the serial data are effected on the basis of the operations of a serial address counter 20 and a serial decoder 19 for decoding the outputs of this serial address counter. More specifically, in the internal data transfer cycle (the data transfer cycle between the random access memory unit 1 and the input/output circuit unit 4), the serial address counter 20 accepts the internal column address signals ac as preset data and generates serial addresses in regular order from the position of a column address corresponding to the preset data. The serial decoder 19 then decodes the serial addresses, whereby the items of the serial data are input/output in regular order. When supplied with a reset signal $\phi_{res}$, to be described later, the serial address counter 20 generates serial addresses for designating the positions of certain predetermined column addresses and increments the column addresses in synchronism with supplied serial clock pulses $\phi_{4sc}$ to be described later.

The input/output circuit unit 4 has a first serial input-/output circuit 21 which transfers uncompressed data (hereinbelow, simply termed "ordinary data") to and from the exterior of the semiconductor memory device 52, and a second serial input/output circuit 22 which transfers compressed data to and from the exterior. The connection of either the first or second serial input/output circuits with the data register and selector 17 is accomplished by a selector circuit 23. In addition, the compressor circuit 2 compresses the data applied from the first serial input/output circuit 21 and supplies the resulting data to a second serial-data external terminal $D_{s2}$ through the second serial input/output circuit 22. On the other hand, the expander circuit 3 expands the data supplied from the second serial input/output circuit 22 and supplies the resulting data to a first serial-data external terminal $D_{s1}$ through the first serial input/output circuit 21. Here, each of the first and second serial input/output circuits 21, 22 is constructed to include memory means for storing data in the serial-in/serial-out form, and gates for selecting the input/output direction and input/output destination of data. As the simplest arrangement, they can be constructed of a register and selector in the serial-in/serial-out form. Alternatively, they may well be constructed of a serial access memory.

By way of example, one-dimensional encoding/decoding methods can be utilized as methods of compressing/expanding data in the compressor circuit 2 and expander circuit 3.

The controller 5 is supplied through respective predetermined control signal terminals with the external control signals of, for example, a row address strobe signal $\overline{RAS}$, a column address strobe signal $\overline{CAS}$, a write enable signal $\overline{WE}$, a data transfer signal $\overline{DT}$, a data receive signal $\overline{DR}$, mode signals MODE1 and MODE2, a serial clock $\phi_{sc}$, and the serial clock $\phi_{4sc}$ obtained by dividing the frequency of the serial clock $\phi_{sc}$ by 4. The controller 5 discriminates the operation modes of the semiconductor memory device 52 in accordance with the various control signals supplied, and forms various timing signals corresponding thereto.

The row address strobe signal $\overline{RAS}$ is regarded as a chip select signal, and the internal circuits are activated in response to the low level of this signal. In addition, the row address strobe signal $\overline{RAS}$ is utilized for the address multiplex control of the row address signals and the column address signals along with the column address strobe signal $\overline{CA}$. The write enable signal $\overline{WE}$ is used as a control signal for specifying whether a random access through the parallel input/output circuit 13 is a read operation or a write operation. Incidentally, the random access cycle is permitted under the condition that both the data transfer signal $\overline{DT}$ and the data receive signal $\overline{DR}$ are negated to the high level thereof. The data transfer signal $\overline{DT}$ is regarded as a signal instructive of the data output operation of the input/output circuit unit 4 with the exterior of the semiconductor memory device 52. The data receive signal $\overline{DR}$ is regarded as a signal instructive of the data input operation of the input/output circuit unit 4 with the exterior. The mode signals MODE1 and MODE2 are used as mode setting signals for determining the compression/expansion operations and the operations of the serial input/output circuits 21, 22 in the state in which the data transfer signal $\overline{DT}$ or the data receive signal $\overline{DR}$ is asserted. When both the data transfer signal $\overline{DT}$ and the data receive signal $\overline{DR}$ are set at the low level thereof, the controller 5 forms the reset signal $\phi_{res}$ and then supplies it to the compressor circuit 2, expander circuit 3 and serial address counter 20.

Figure 2:
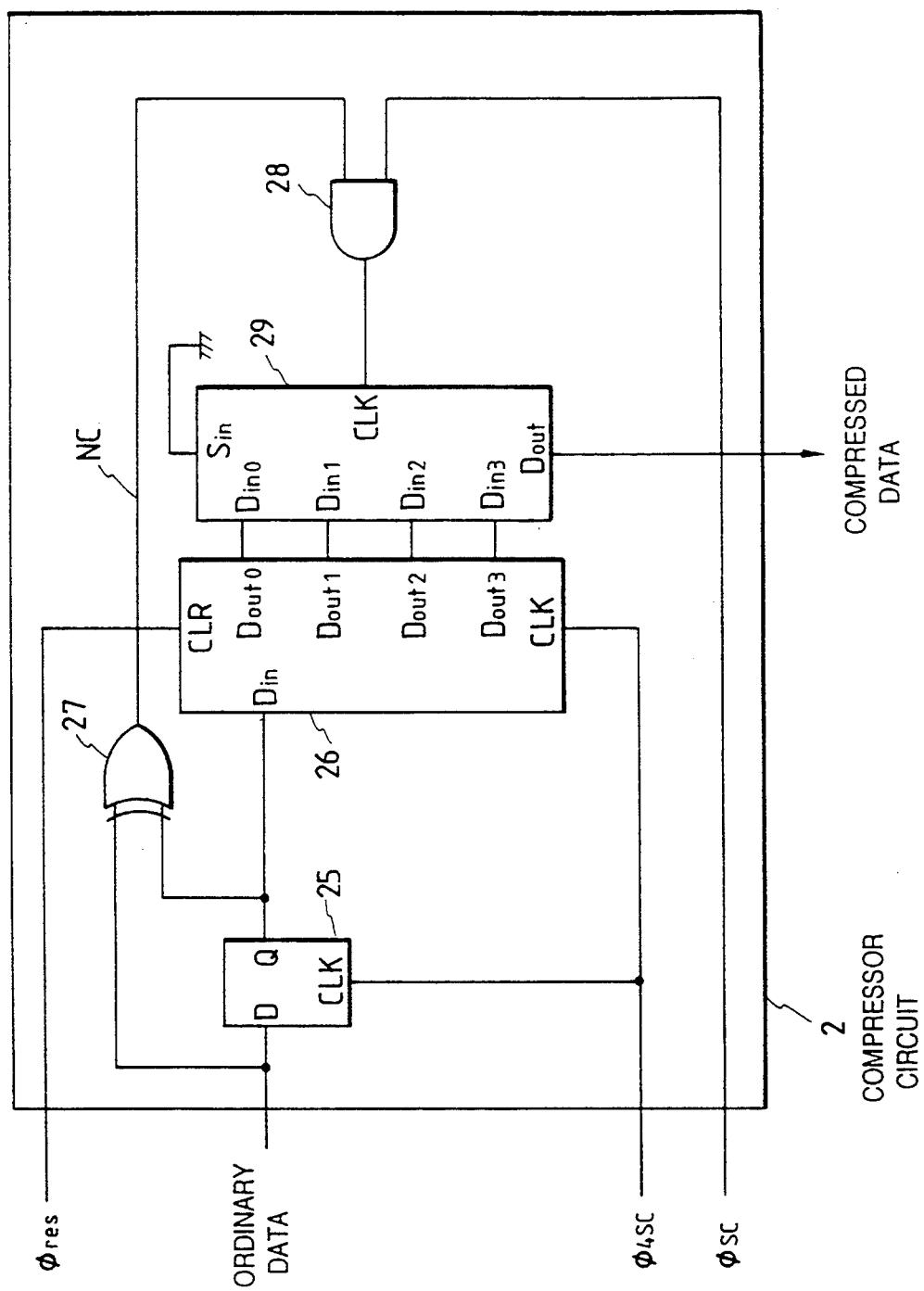
FIG. 2 is a block diagram of an example of a compressor circuits.

FIG. 2 shows a block diagram of an example of the compressor circuit 2 for realizing the one-dimensional encoding method. Now, this compressor circuit 2 will be described.

The compressor circuit 2 is supplied with the reset signal $\phi_{res}$, serial clock $\phi_{sc}$, serial clock $\phi_{4sc}$ (with the frequency of the serial clock $\phi_{sc}$ divided by 4), and ordinary data.

A D-type latch circuit 25 latches the items of ordinary data supplied successively in synchronism with the serial clock pulses $\phi_{4sc}$. An up-counter 26 is initialized (cleared) by the reset signal $\phi_{res}$ of a high level supplied thereto. While the reset signal $\phi_{res}$ is at the low level, the up-counter 26 counts the number of the pulses of the serial clock $\phi_{4sc}$ every period of time lapsing till the change of the output of the D-type latch circuit 25. An exclusive-OR circuit 27 detects the non-coincidence between the input and output of the D-type latch circuit 25, namely, the non-coincidence between successive bits in the serial input operation. An AND gate 28 provides the serial clock pulse $\phi_{sc}$ when the exclusive-OR circuit 27 has detected the disagreement between the input and output of the D-type latch circuit 25. A shift register 29 provides the count value of the up-counter 26 in synchronism with the serial clock pulse $\phi_{sc}$ supplied from the AND gate 28. Accordingly, the output of the shift register 29 becomes the code information of the serial data, that is, the compressed data. The shift register 29 has its serial-in terminal $S_{in}$ grounded, and therefore accepts a signal of ground level thereinto every shift operation.

Figure 3:
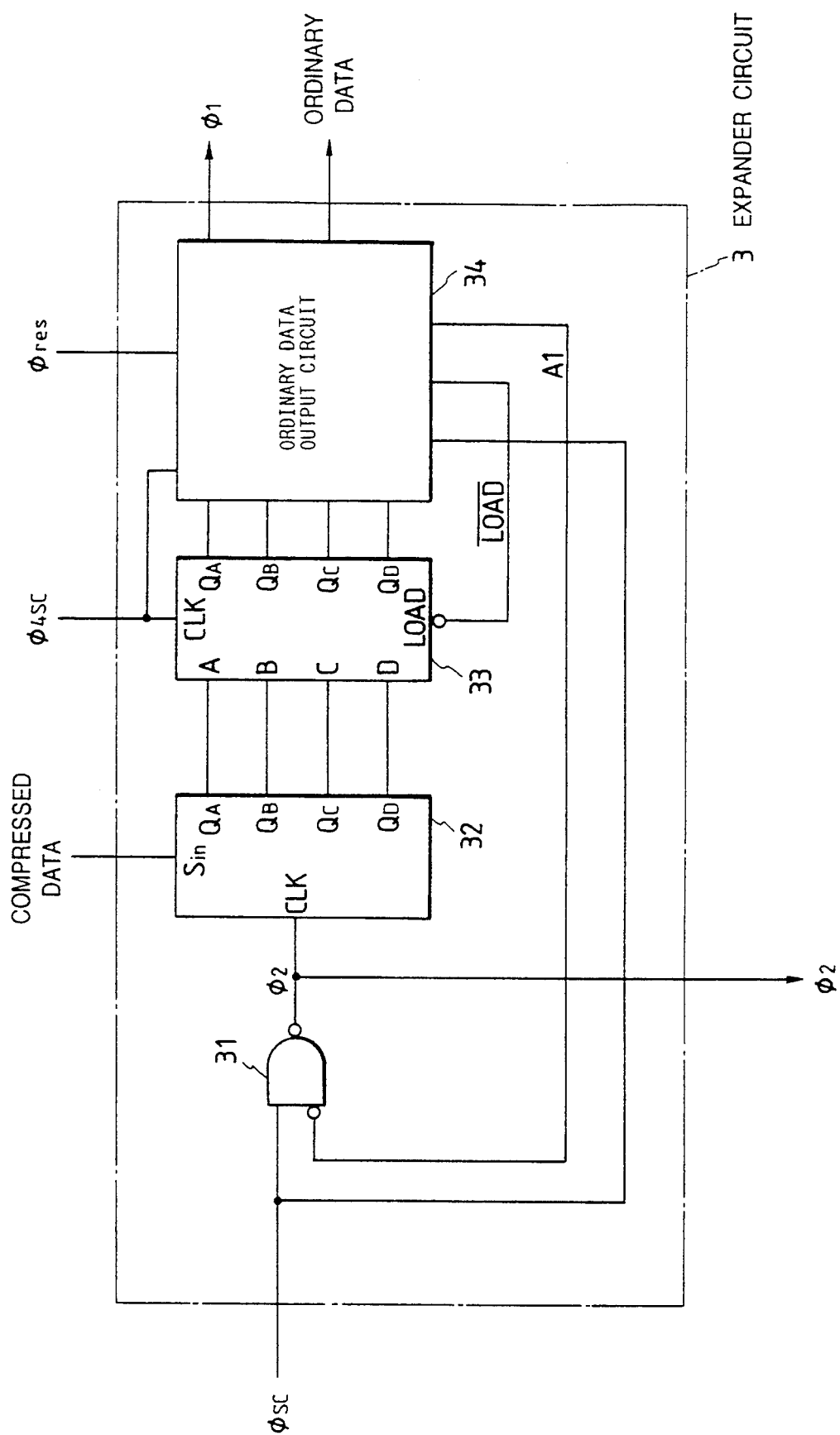
FIG. 3 is a block diagram of an example of an expander circuit.

FIG. 3 shows a block diagram of an example of the expander circuit 3 for realizing the one-dimensional decoding method. Now, this expander circuit 3 will be described.

The expander circuit 3 is supplied with the reset signal $\phi_{res}$, serial clock $\phi_{sc}$, serial clock $\phi_{4sc}$ with the frequency of the serial clock $\phi_{sc}$ divided by 4, and compressed data.

A shift register 32 accepts the compressed data through its serial-in terminal $S_{in}$ in synchronism with a signal $\phi_2$ which is output from a NAND gate 31. The output signal $\phi_2$ of the NAND gate 31 is also supplied to the second serial input/output circuit 22. A down-counter 33 operates to count down data items supplied from the shift register 32, in synchronism with the serial clock pulses $\phi_{4sc}$. An ordinary-data output circuit 34 delivers a load signal $\overline{LOAD}$ to the down-counter 33; a signal $\overline{\phi_1}$ and the ordinary data to the first serial input/output circuit 21; and a signal $\phi_1$ as one input to the NAND gate 31.

Figure 4:
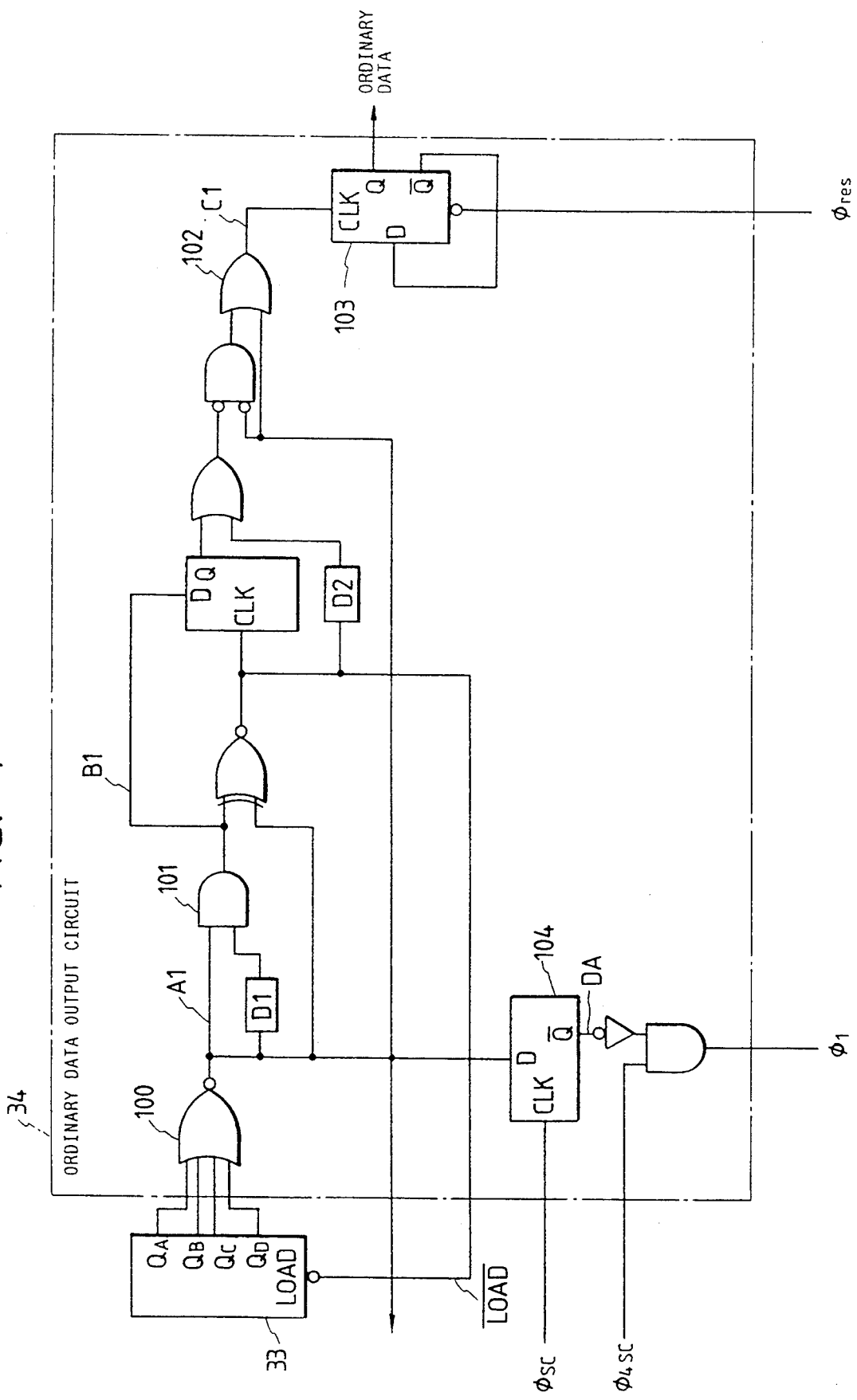
FIG. 4 is a circuit diagram of an example of an ordinary data output circuit.

FIG. 4 is a circuit diagram of an example of the ordinary-data output circuit 34. A NOR gate 100 receives the output Signals of the down-counter 33, and forms a signal A1. The output signal of an AND gate 101 which receives the signal A1 and the output signal of a delay circuit D1, is denoted by symbol B1. The output signal of an OR gate 102 is denoted by symbol C1. This output signal C1 of the OR gate 102 is supplied to the clock terminal CLK of a D-type flip-flop 103. A signal delivered from this D-type flip-flop 103 is the ordinary data. In addition, symbol DA is let to denote the output signal of another D-type flip-flop 104. Each of delay circuits D1 and D2 is configured of, for example, an even number of inverter circuits.

FIGS. 5A through 5F show the aspects of the operation modes which can be set with the mode signals MODE1 and MODE2.

Figure 5A:
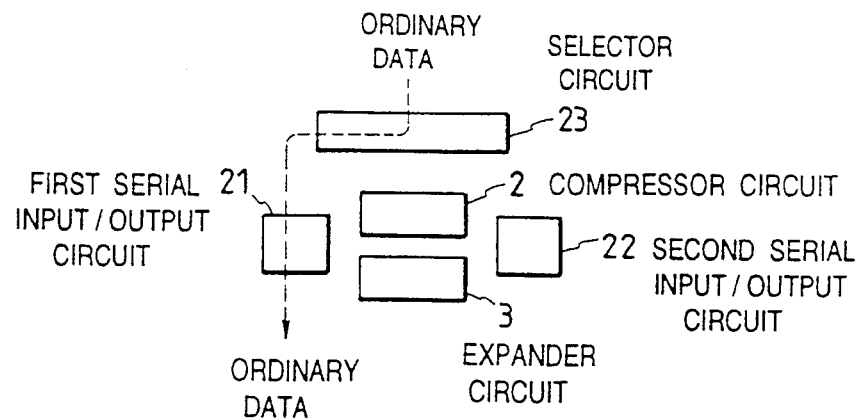
FIGS. 5A through 5F are diagrams for explaining the aspects of some operation modes in the semiconductor memory device in FIG. 1.
Figure 5B:
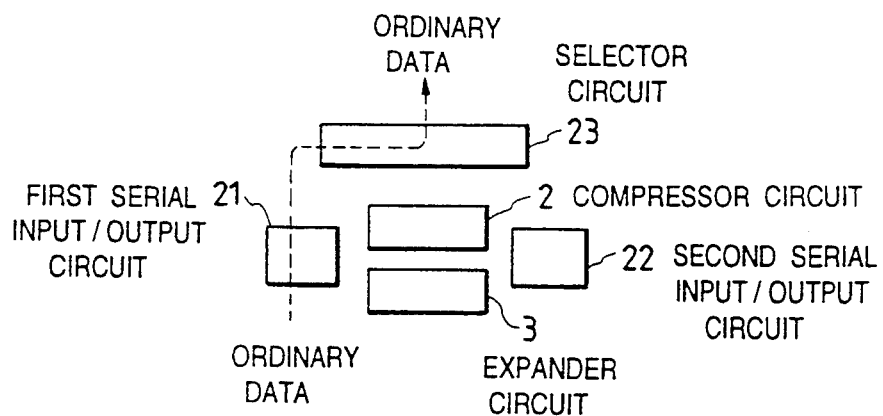

Each of FIGS. 5A and 5B illustrates the operating aspect in which the serial data not subjected to the compression/expansion operation can be transferred between the random access memory unit 1 and the exterior of the semiconductor memory device 52 of the present invention (hereinbelow, simply termed "the exterior"). More specifically, the operation mode depicted in FIG. 5A is set by the signal levels of MODE1 = low level, MODE2 = low level, $\overline{DT}$ = low level, and $\overline{DR}$ = high level. Herein, the ordinary data having been stored in the memory cell array 10 is passed through the data register and selector 17 as well as the selector circuit 23 and is serially output from the first serial input/output circuit 21 to the exterior. On the other hand, the operation mode depicted in FIG. 5B is set by the signal levels of MODE1 = low level, MODE2 = low level, $\overline{DT}$ = high level, and $\overline{DR}$ = low level. Herein, the ordinary data supplied from the exterior to the first serial input/output circuit 21 is written into the memory cell array 10 through the selector circuit 23 as well as the data register and selector 17. In such a case where the semiconductor memory device 52 of this embodiment is utilized as the frame buffer memory for displaying pictures, the first serial input/output circuit 21 can be used as an output port for a video signal by setting the operation mode shown in FIG. 5A.

Figure 5C:
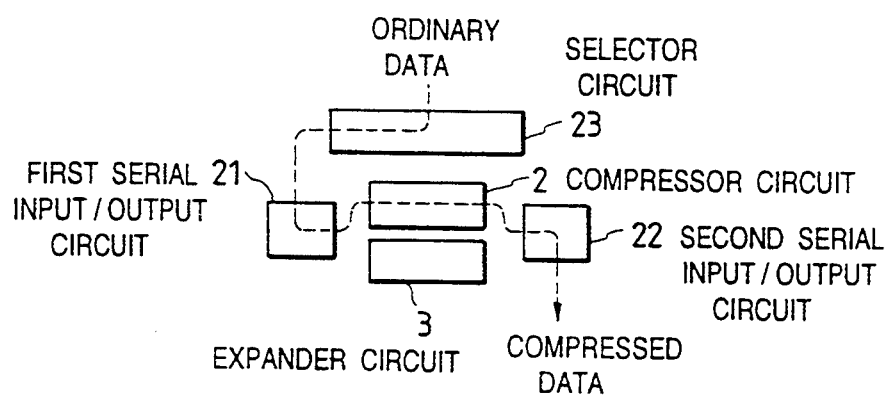
Figure 5D:
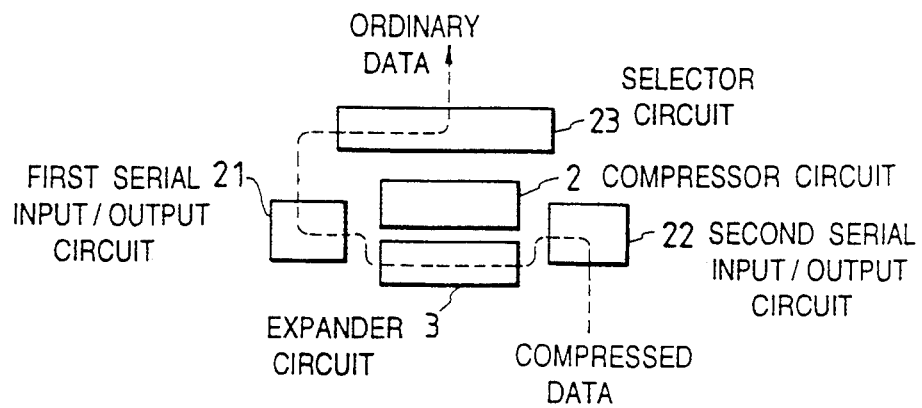

Each of FIGS. 5C and 5D illustrates operation in the case where the compressed data is serially transferred to or from the exterior when the random access memory unit 1 is utilized as storage for the ordinary data. More specifically, the operation mode depicted in FIG. 5C is set by the signal levels of MODE1 = high level, MODE2 = low level, $\overline{DT}$ = low level, and $\overline{DR}$ = high level. The ordinary data delivered through the data register and selector 17, the selector circuit 23, and the first serial input/output circuit 21 is converted into the compressed data by passing through the compressor circuit 2. The compressed data is then serially output from the second serial input/output circuit 22 to the exterior. On the other hand, the operation mode depicted in FIG. 5D is set by the signal levels of MODE1 = high level, MODE2 = low level, DT× = high level, and $\overline{DR}$ = low level. Herein, the compressed data supplied from the exterior to the second serial input/output circuit 22 is converted into the ordinary data by passing through the expander circuit 3. The ordinary data is then written into the memory cell array 10 through the first serial input/output circuit 21, the selector circuit 23 and the data register and selector 17. When utilizing the semiconductor memory device 52 of this embodiment for the buffer area of pixel unit information, image information such as that generated in facsimile, can be compressed into codes which are transmitted. This is accomplished with ease and at high speed by setting the operation mode as shown in FIG. 5C. When the operation mode shown in FIG. 5D is set on the receiving side of the facsimile or the like, received data can be temporarily stored and be simultaneously expanded.

Figure 5E:
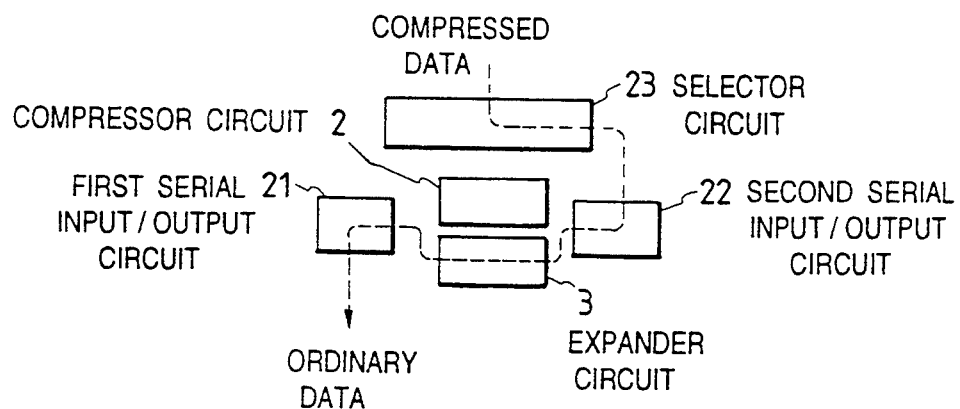
Figure 5F:
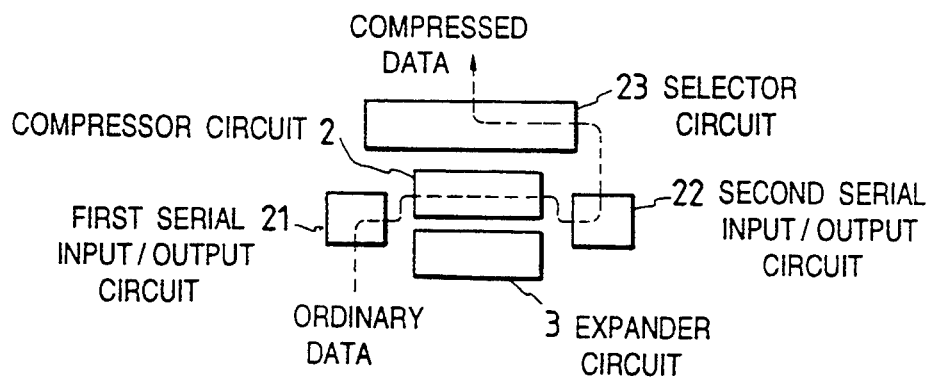

Each of FIGS. 5E and 5F illustrates operation in the case where the ordinary data is serially transferred to or from the exterior when the random access memory unit 1 is utilized as an area for storing the compressed data. More specifically, the operation mode depicted in FIG. 5E is set by the signal levels of MODE1 = high level, MODE2 = high level, $\overline{DT}$ = low level, and $\overline{DR}$ = high level. Herein, the compressed data which is delivered through the data register and selector 17, the selector circuit 23, and the second serial input/output circuit 22 is converted into the ordinary data by passing through the expander circuit 3. The ordinary data is then serially output from the first serial input/output circuit 21 to the exterior. On the other hand, the operation mode depicted in FIG. 5F is set by the signal levels of MODE1 = high level, MODE2 = high level, $\overline{DT}$ = high level, and $\overline{DR}$ = low level. Herein, the ordinary data supplied from the exterior to the first serial input/output circuit 21 is converted into the compressed data by passing through the compressor circuit 2. The compressed data is then written into the memory cell array 10 through the second serial input/output circuit 22, the selector circuit 23, and the data register and selector 17. The effect of enlarging the storage capacity of the memory cell array 10 can be attained by setting the operation mode shown in FIG. 5E or FIG. 5F.

Figure 6:
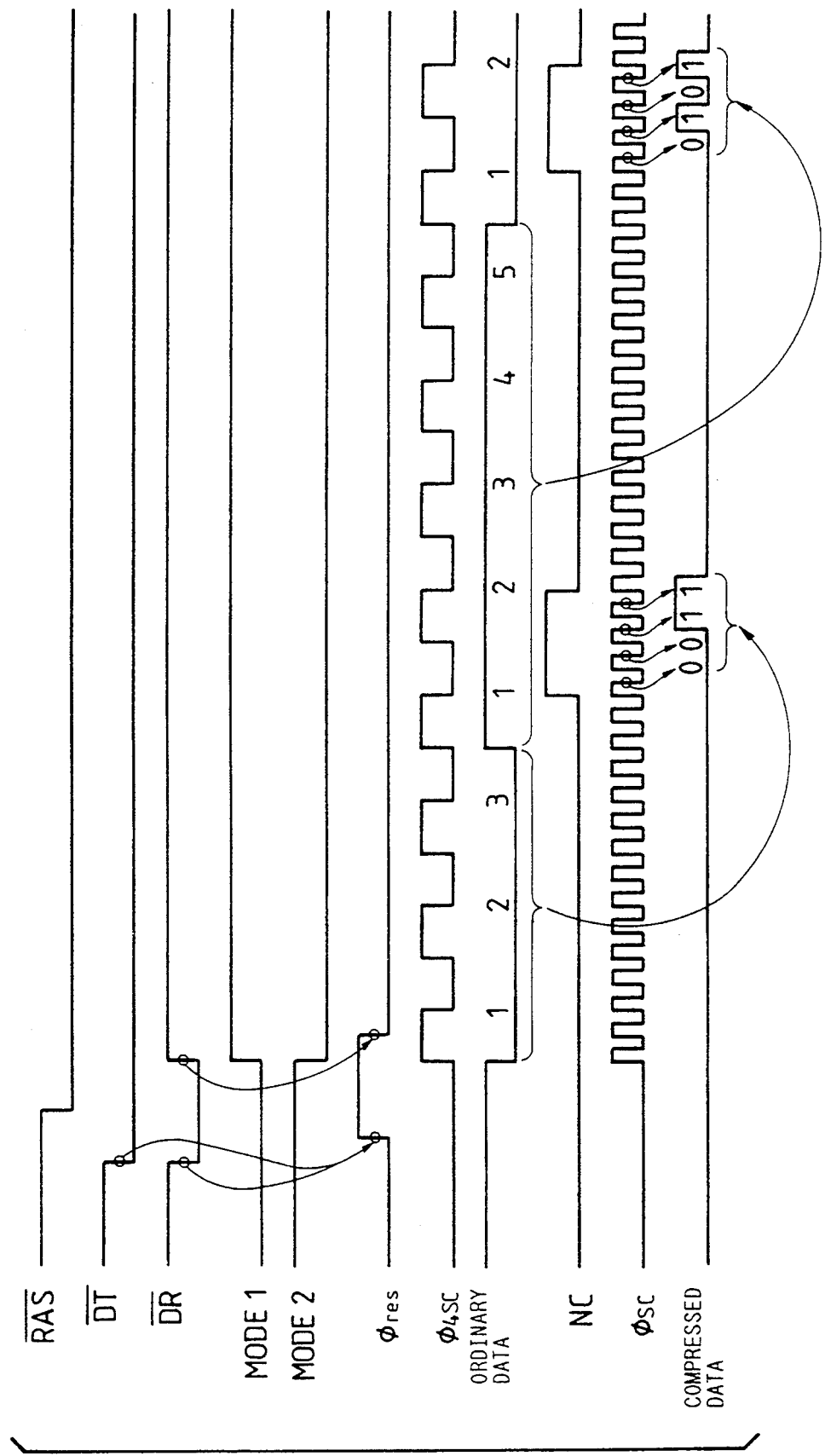
FIG. 6 exemplifies a timing chart in the operation mode in FIG. 5C.

FIG. 6 exemplifies an operation timing chart in the operation mode of FIG. 5C.

When both the data transfer signal $\overline{DT}$ and the data receive signal R/ are set at the low level (before the change of the row address strobe signal RAS from the high level to the low level), the controller 5 detects this situation and changes to a serial access mode. The serial access mode is a mode in which the random access memory unit 1 transfers data to or from the exterior through the input/output circuit unit 4. The reset signal $\phi_{res}$ rises in response to the trailing edges of the data transfer signal $\overline{DT}$ and the data receive signal $\overline{DR}$. Thereafter, the reset signal $\phi_{res}$ becomes the low level in response to the rise of the data receive signal $\overline{DR}$. Here, the mode signal MODE1 is at the high level, and the mode signal MODE2 is at the low level, so that the compressed data obtained by passing the ordinary data from the random access memory unit 1 through the compressor circuit 2 of the input/output circuit unit 4 is serially output to the exterior.

The up-counter 26 starts counting the pulses of a signal supplied from the D-type latch circuit 25 in synchronism with the trailing edge of the serial clock pulse $\phi_{4sc}$ which is subsequent to the fall of the reset signal $\phi_{res}$. It re-counts the pulses each time the level of the signal supplied from the D-type latch circuit 25 changes. When the non-coincidence between the input and output of the D-type latch circuit 25 is detected by the exclusive OR circuit 27, a non-coincidence detection signal NC becomes the high level. While the non-coincidence detection signal NC is at the high level, the shift register 29 delivers the counted results of the up-counter 26 in synchronism with the trailing edges of the serial clock pulses $\phi_{sc}$. The signal delivered from the shift register 29 are supplied to the second serial-data external terminal $D_{s2}$ through the second serial input/output circuit 22 as items of compressed data. By the way, the low level ordinary data corresponding to 3 clock cycles of the serial clock $\phi_{4sc}$ becomes 4-bit binary data corresponding to 1 clock cycle of the serial clock $\phi_{4sc}$ when passed through the compressor circuit 2. Also, the ordinary data of high level corresponding to 5 clock cycles of the serial clock $\phi_{4sc}$ becomes 4-bit binary data corresponding to 1 clock cycle of the serial clock $\phi_{4sc}$ when passed through the compressor circuit 2.

The operation mode shown in FIG. 5F is established when, in FIG. 6, both the data transfer signal $\overline{DT}$ and the data receive signal $\overline{DR}$ become the low level. As a consequence of which, the data transfer signal $\overline{DT}$ and the mode signals MODE1, MODE2 become the high level with the data receive signal DR held at the low level.

Figure 7:
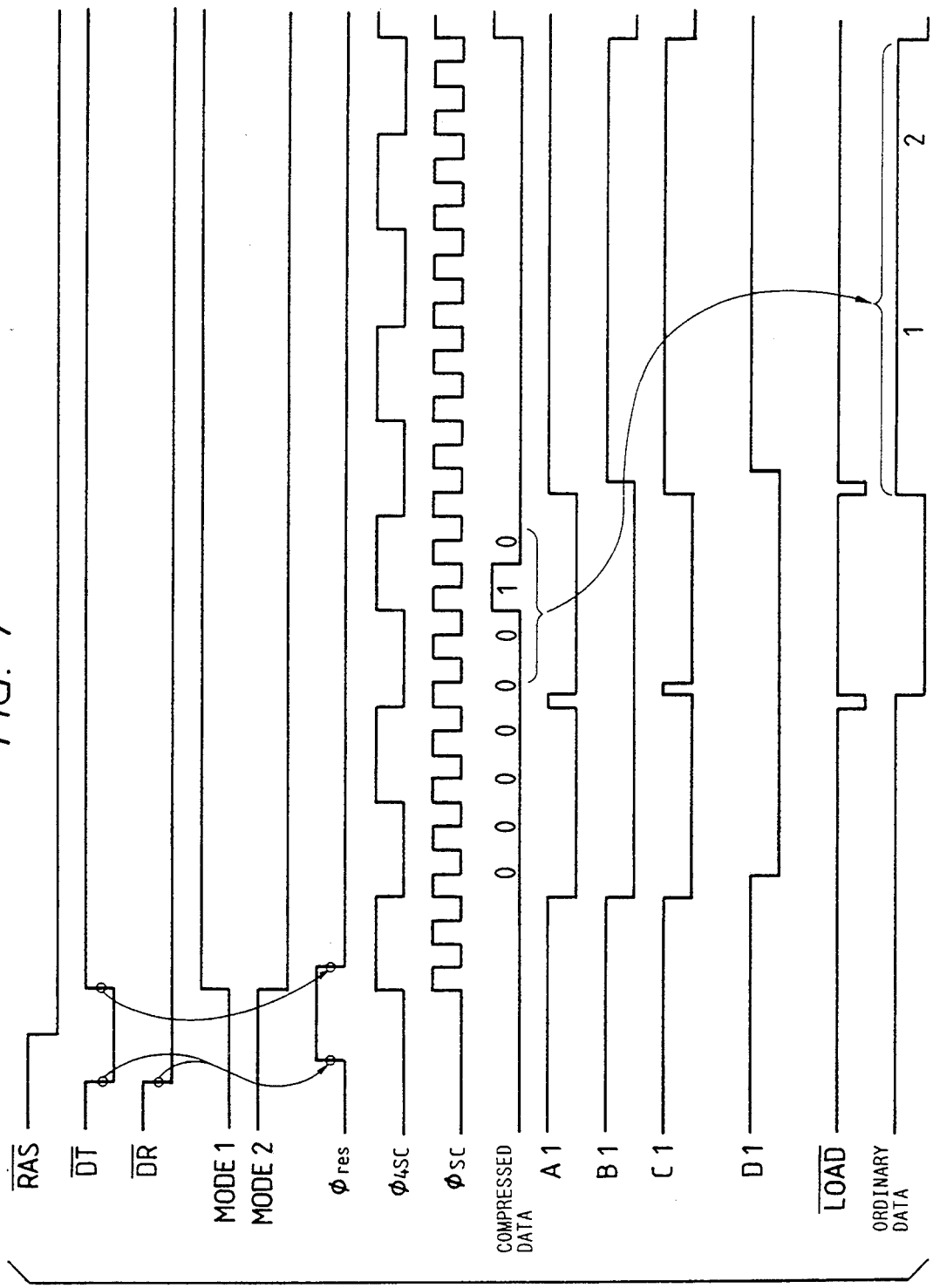
FIG. 7 exemplifies a timing chart in the operation mode in FIG. 5D.

FIG. 7 shows an example of an operation timing chart in the operation mode of FIG. 5D.

After both the data transfer signal $\overline{DT}$ and the data receive signal $\overline{DR}$ have become the low level, the data transfer signal $\overline{DT}$ and the mode signal MODE1 become the high level and the mode signal MODE2 becomes the low level with the data receive signal $\overline{DR}$ held at the low level. Thus, the data supplied to the second serial-data external terminal $D_{s2}$ is passed through the expander circuit 3, and the ordinary data is stored in the random access memory unit 1.

When the signal A1 has become the low level, the shift register 32 accepts the pulses of the signal supplied to its serial-in terminal $S_{in}$, as the compressed data in synchronism with the serial clock pulses $\phi_{sc}$. The signal B1 becomes the low level in accordance with the signal A1 rendered the low level. The load signal $\overline{LOAD}$ becomes the low level at the non-coincidence between the signals A1 and $\overline{\phi}_1$. The signal C1 serves as the clock signal of the D-type flip-flop 103. When the signal D1 is at the high level, the ordinary data is output from the first serial input/output circuit 21. By the way, 4-bit binary data "0010" corresponding to 1 clock cycle of the serial clock $\phi_{4sc}$ becomes the ordinary data corresponding to 2 clock cycles of the serial clock $\phi_{4sc}$ when passed through the expander circuit 3.

The operation mode shown in FIG. 5E is established when, in FIG. 7, the data transfer signal $\overline{DT}$ becomes the low level and the data receive signal $\overline{DR}$ and the mode signals MODE1, MODE2 become the high level.

Figure 8A:
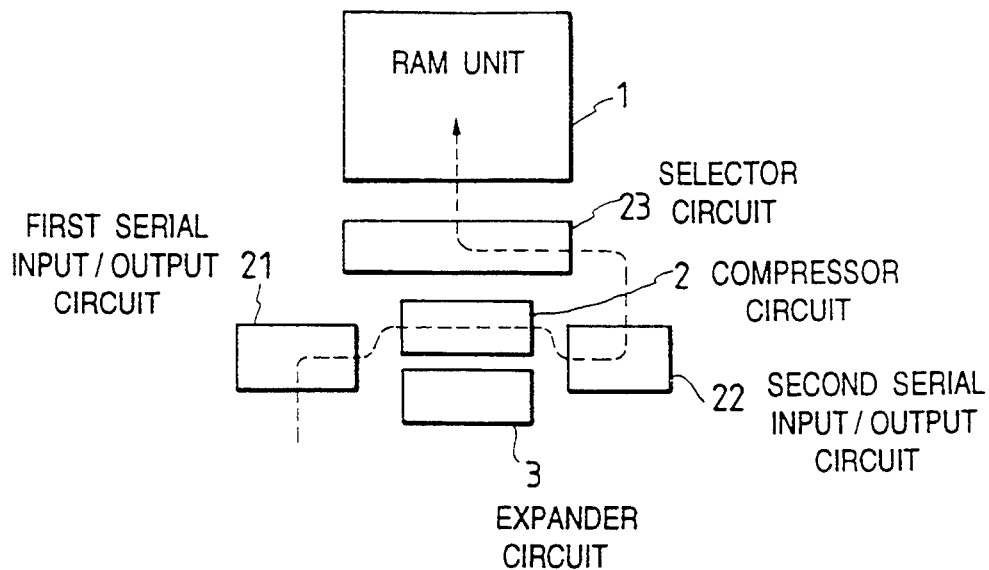
FIGS. 8A and 8B are diagrams for explaining the aspects of an exemplary operation mode for enhancing data security on the basis of a plurality of times of compression processes.
Figure 8B:
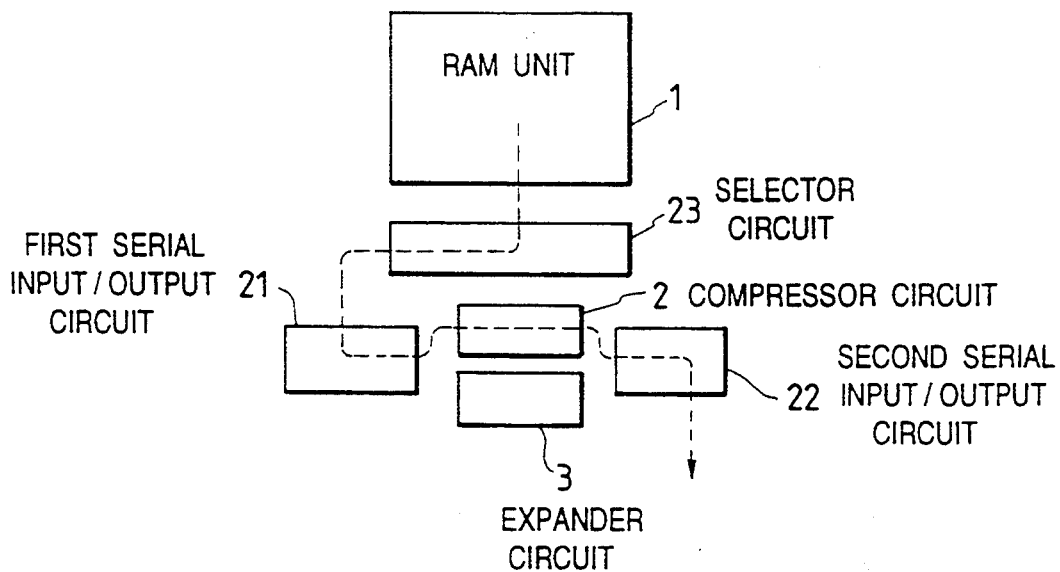
Figure 9A:
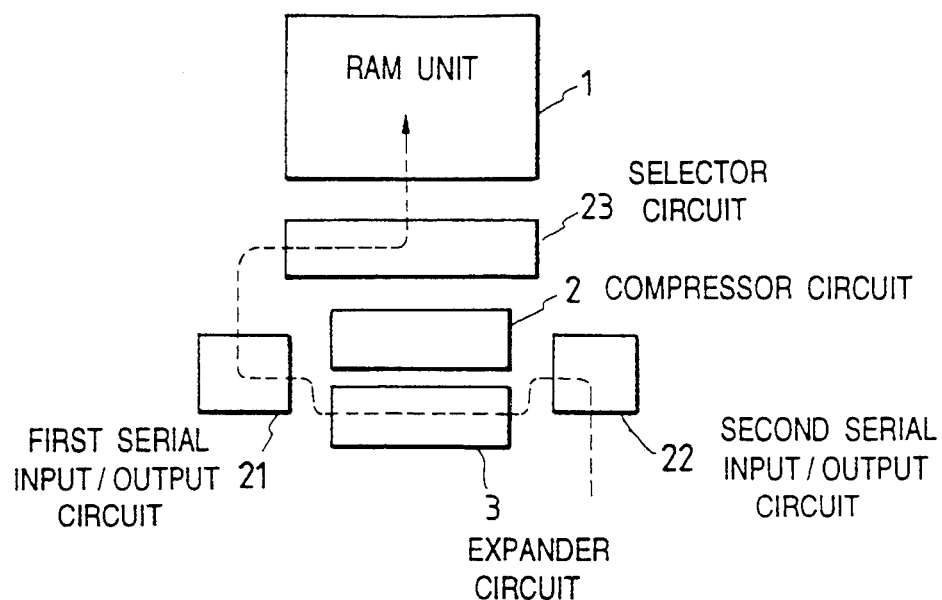
FIGS. 9A and 9B are diagrams for explaining the aspects of an exemplary operation mode for enhancing data security on the basis of a plurality of times of expansion processes.
Figure 9B:
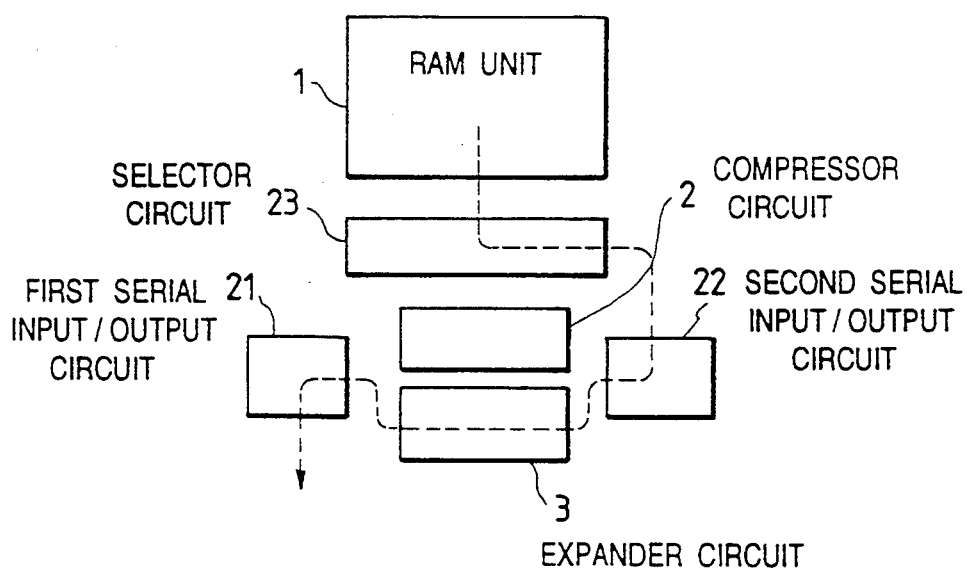

FIGS. 8A and 8B illustrate an example of operation in which the ordinary data is compressed twice in order to enhance security in the transmission of the pertinent data, i.e., double compression. More specifically, when the ordinary data for the data transmission is transferred from within the system including the semiconductor memory device 52, it is compressed allow storage in the random access memory unit 1 as shown in FIG. 8A. When the stored data is to be transmitted to another system, the compressed data read out of the random access memory unit 1 is further compressed. This is sent out as the resulting data shown in FIG. 8B. FIGS. 9A and 9B illustrate an example of processing in the system which receives the data compressed twice as stated above, i.e., double compression. More specifically, at the time of reception, the received data is expanded once to allow temporary storage of the resulting data in the random access memory unit 1 as shown in FIG. 9A. Thereafter, when such data is to be output for use in any process within the other system, it is expanded once more to deliver the resulting data as shown in FIG. 9B.

Figure 10:
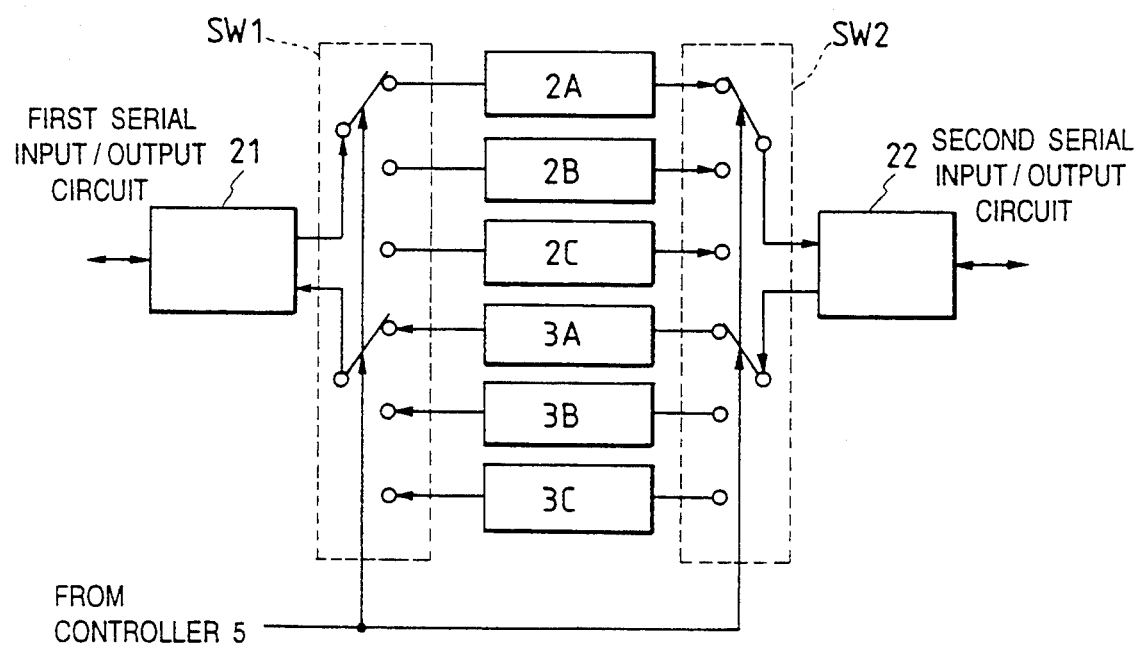
FIG. 10 is a block diagram showing another example of an input/output circuit unit.

FIG. 10 shows an example in which a plurality of compressor circuits 2A–2C and a plurality of expander circuits 3A–3C having different algorithms for the compression/expansion processes are built beforehand. The first serial input/output circuit 21 and the second serial input/output circuit 22 are connected with predetermined input/output circuits of the compression/expansion circuits by respective switch means SW1 and SW2 in compliance with the required use of a system. By way of example, the switch means SW1 and SW2 are controlled by a control signal from the controller 5. By especially adopting such an arrangement, the compression/expansion can be executed with a high versatility for: 1) the system to which the present invention is applied; 2) compression/expanding logic; or 3) the kind of data to be handled. By the way, in the arrangement of FIG. 10, the first and second serial input/output circuits 21, 22 may well be altered to parallel input/output circuits in accordance with the compressing/expanding logic thereof.

Figure 11:
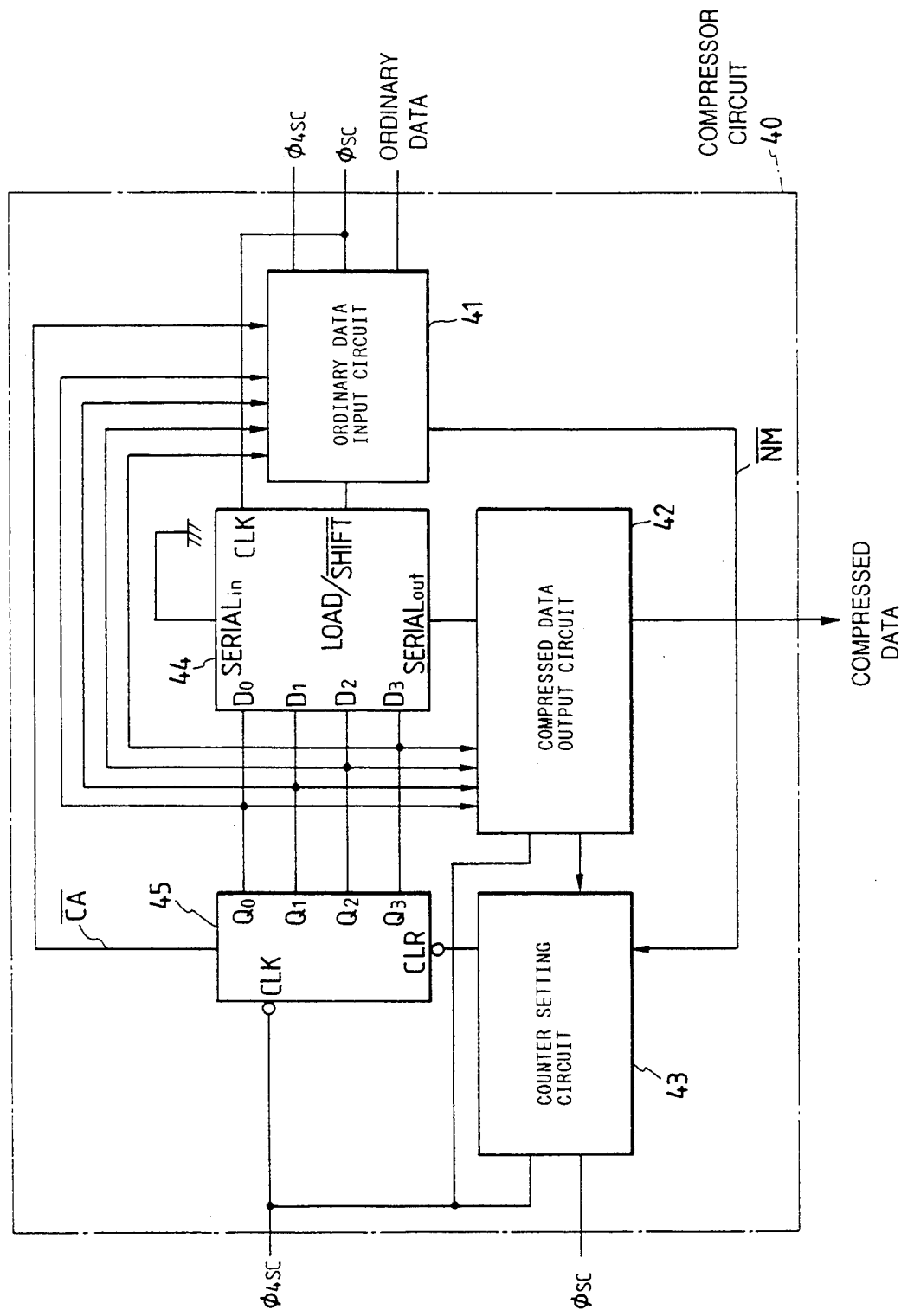
FIG. 11 is a block diagram of another example of the compressor circuit.

FIG. 11 is a block diagram exemplifying a compressor circuit which is different from the compressor circuit 2 in FIG. 2. The compressor circuit 40 in FIG. 11 is supplied with the serial clock $\phi_{sc}$, the serial clock $\phi_{4sc}$ with the frequency of the serial clock $\phi_{sc}$ divided by 4, and the ordinary data. This compressor circuit 40 includes an ordinary data input circuit 41, a compressed data output circuit 42, a counter setting circuit 43, a shift register 44, and an up-counter 45.

Figure 12:
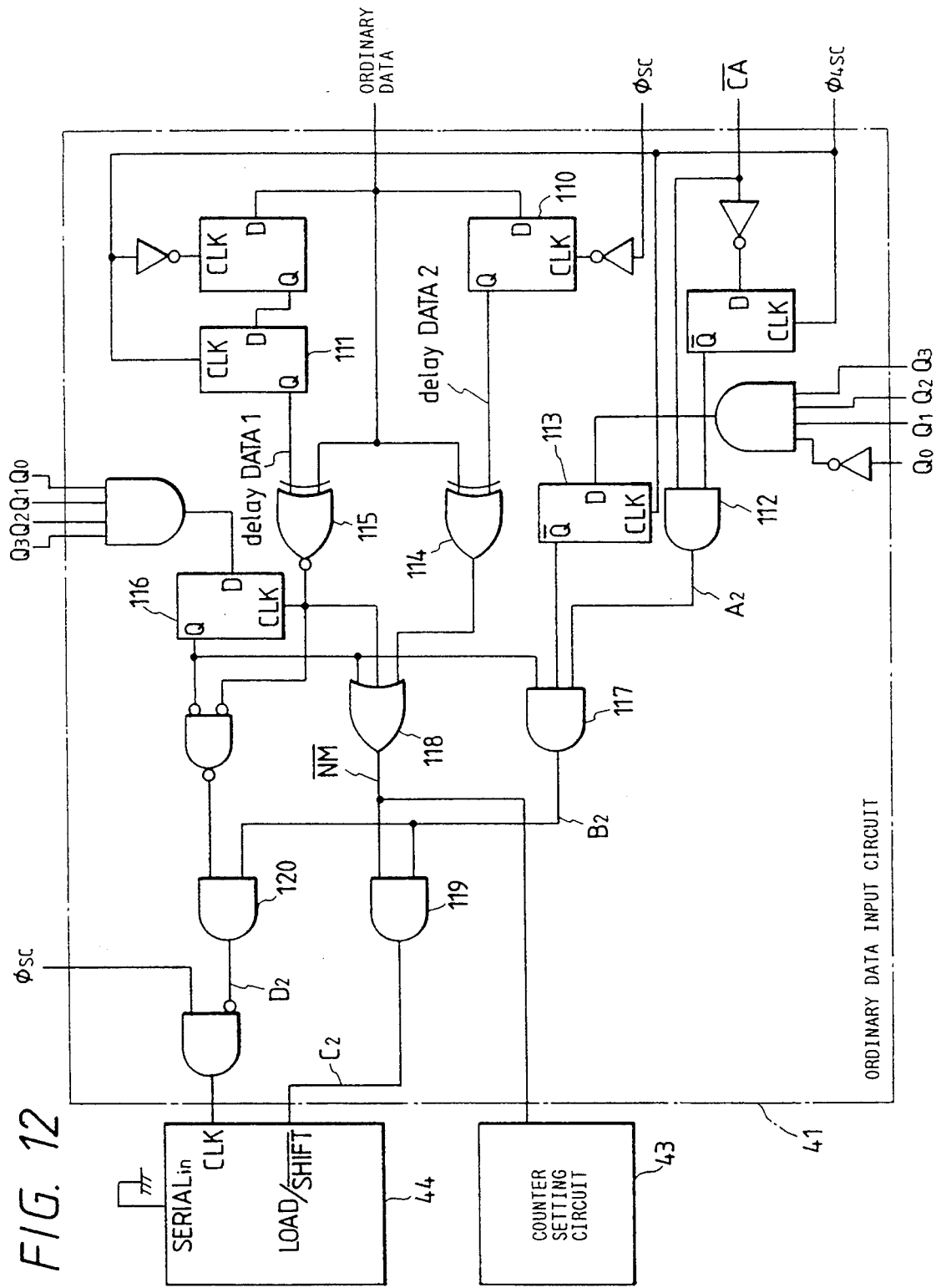
FIG. 12 is a circuit diagram of an example of an ordinary data input circuit.

FIG. 12 is a circuit diagram showing an example of the ordinary data input circuit 41. This ordinary data input circuit 41 is supplied with the two types of serial clock signals $\phi_{sc}$, $\phi_{4sc}$, the ordinary data, 4-bit parallel data $Q_0$–$Q_3$ from the up-counter 45, and a carry signal $\overline{CA}$ which informs the circuit 41 of the fact that a value of 15 counts has been exceeded in the count operation of the up-counter 45. In the figure, "delay DATA2" denotes the output signal of a D-type flip-flop 110, "delay DATA1" denotes the output signal of a D-type flip-flop 111, and "A2" denotes the output signal of an AND gate 112. Numeral 114 indicates an exclusive-OR circuit which receives two signals: the ordinary data, and the signal "delay DATA2". Numeral 115 indicates an exclusive-NOR circuit which also receives two signals: the ordinary data, and the signal "delay DATA1". Shown at numeral 116 is a D-type flip-flop which is clocked by the output signal of the exclusive-NOR circuit 115. An AND gate 117 is supplied with three signals: the signal A2 and the outputs from D-type flip-flops 113 and 116. It then delivers its output signal B2 to AND gates 119 and 120. An OR gate 118 is supplied with three signals: the output from the D-type flip-flop 116, exclusive-NOR circuit 115, and exclusive-OR circuit 114. It then delivers its output signal $\overline{NM}$ to the AND gate 119 and the counter setting circuit 43. A signal denoted by symbol C2 is the output of the AND gate 109, and this signal C2 is supplied to the shift register 44. Symbol D2 denotes the output signal of the AND gate 120. During the low level of the signal D2, the shift register 44 accepts the signal C2 in synchronism with the serial clock $\phi_{sc}$ if this signal C2 is at the high level. It accepts a signal of ground level from its serial-in terminal $S_{in}$ in synchronism with the serial clock $\phi_{sc}$ if the signal C2 is at the low level.

Figure 13:
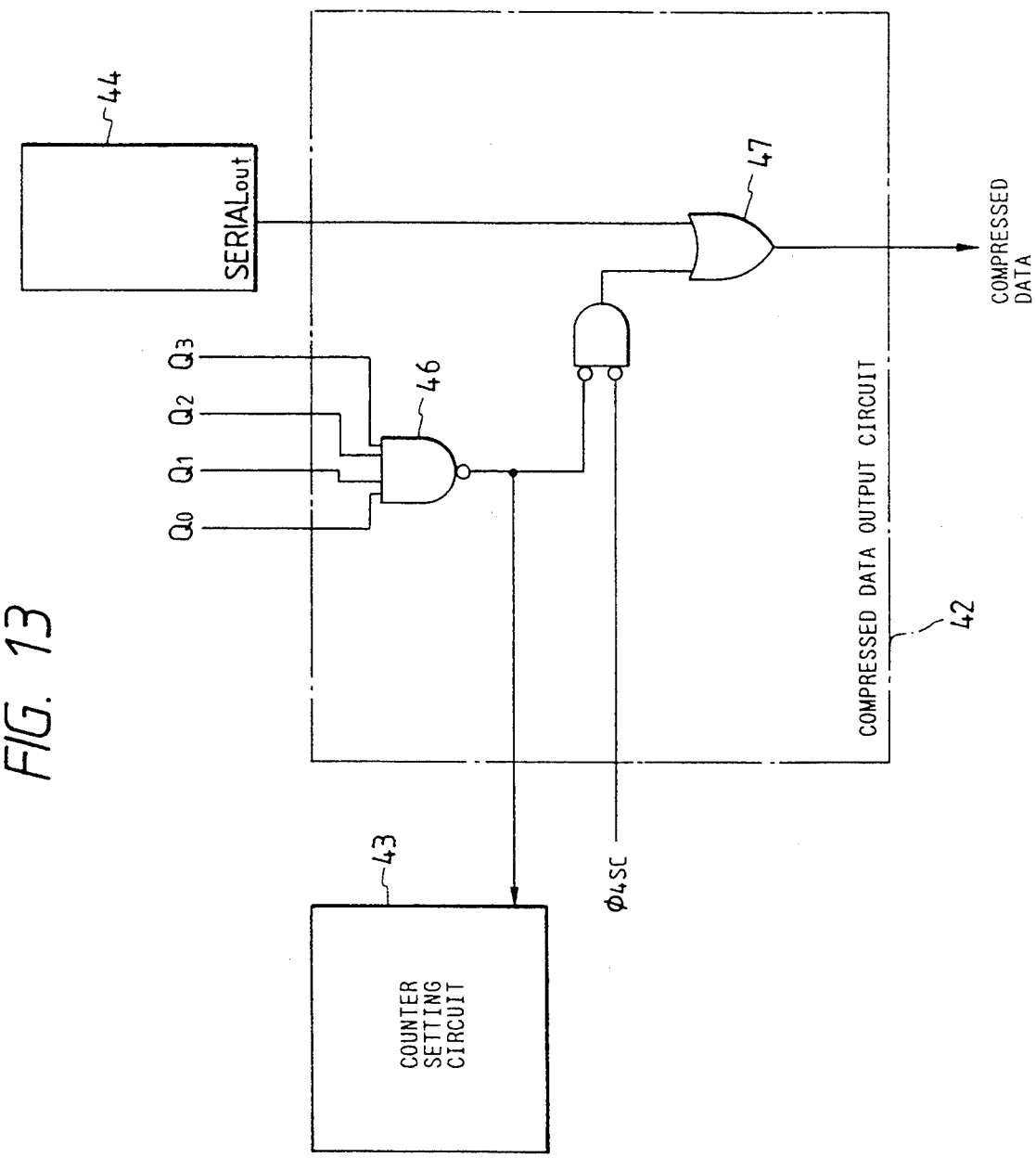
FIG. 13 is a circuit diagram of an example of a compressed data output circuit.

FIG. 13 is a circuit diagram showing an example of the compressed data output circuit 42. This compressed data output circuit 42 is supplied with the serial clock $\phi_{4sc}$, the 4-bit parallel data $Q_0$–$Q_3$ provided from the up-counter 45, and data serially shifted out of the shift register 44. A NAND gate 46 supplies its output signal to the counter setting circuit 43. A signal delivered from an OR gate 47 serves as the compressed data.

Figure 14:
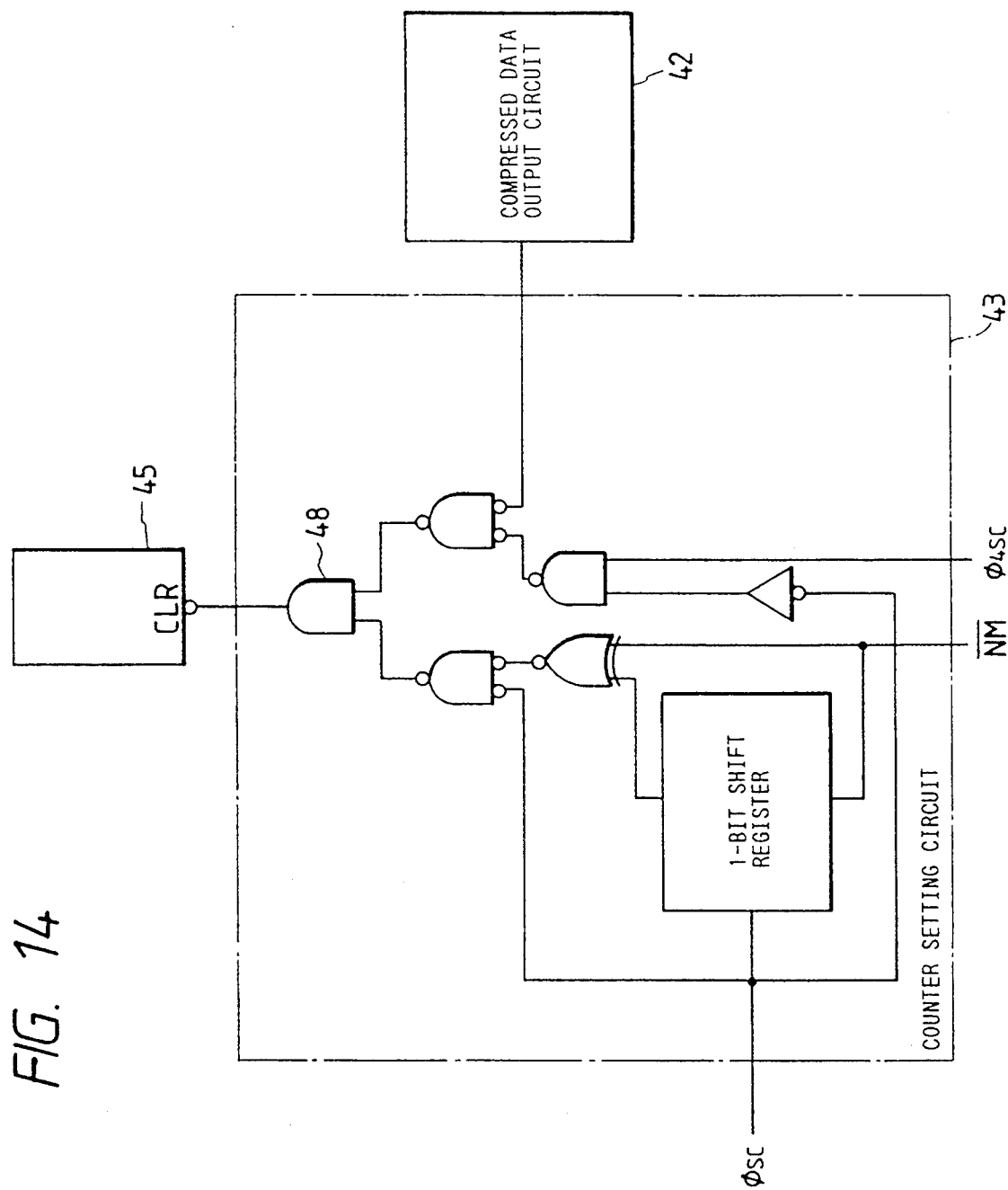
FIG. 14 is a circuit diagram of an example of a counter setting circuit.

FIG. 14 is a circuit diagram showing an example of the counter setting circuit 43. This counter setting circuit 43 is supplied with the two types of serial clock signals $\phi_{sc}$, $\phi_{4sc}$, the signal NM from the ordinary data input circuit 41, and the output signal of NAND gate 46 contained within the compressed data output circuit 42. When the output signal of AND gate 48 has been set at the low level by these signals, the up-counter 45 is initialized (cleared).

Figure 15A:
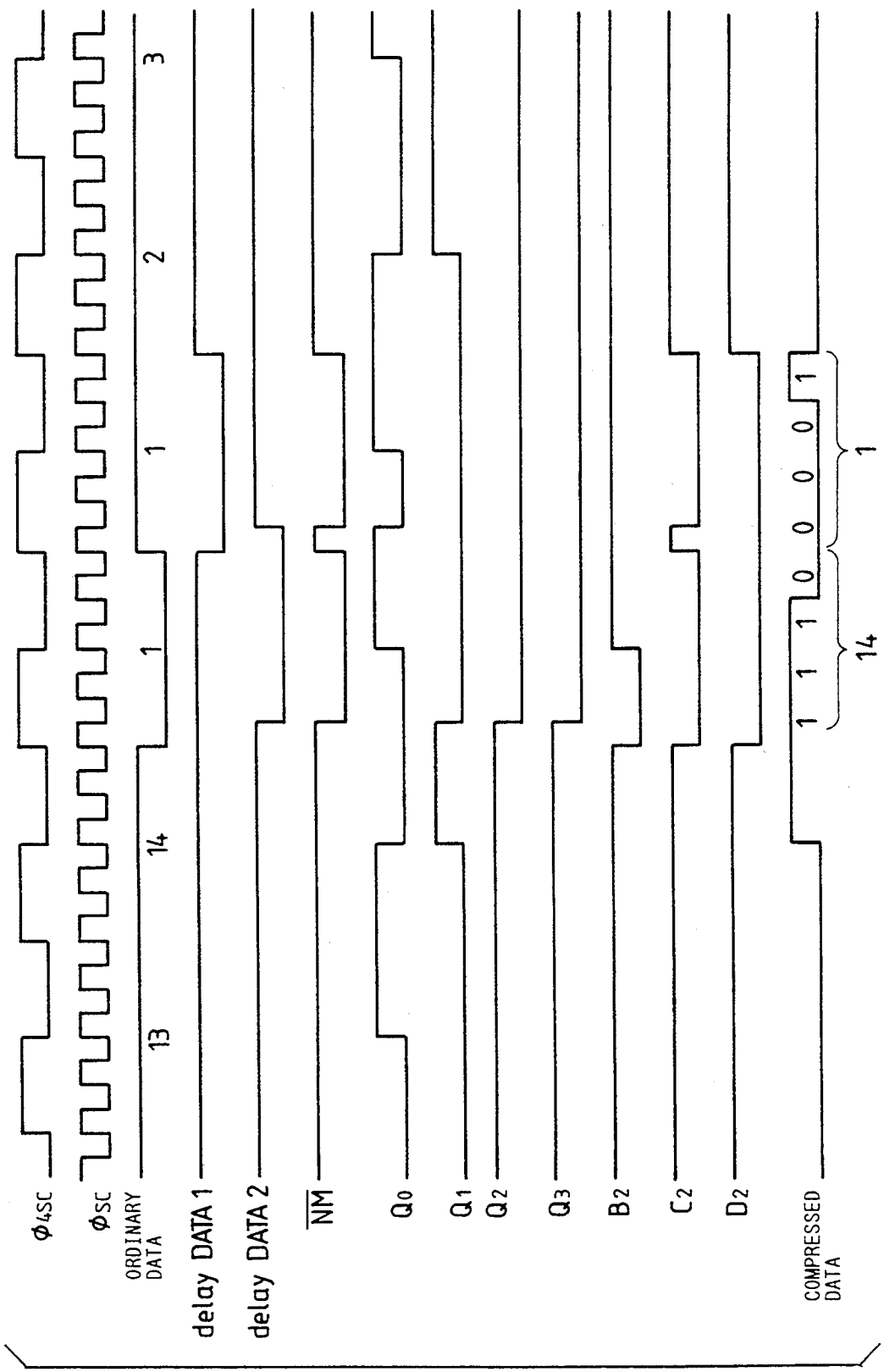

FIG. 15A shows the operation timing chart of the compressor circuit 40 in FIG. 11 where the up-counter 45 has counted the ordinary data of 14 items. Since the D-type flip-flop 111 is preceded by a further D-type flip-flop, the output signal "delay DATA1" changes with a delay corresponding to one clock cycle of the serial clock $\phi_{4sc}$ since the change of the ordinary data.

The output signal $\overline{NM}$ of the OR gate 118 changes in accordance with the signals respectively supplied from the exclusive-OR circuit 114, exclusive-NOR circuit 115, and D-type flip-flop 116. The data bits $Q_0$–$Q_3$ indicate the count status of the up-counter 45.

The signal B2 becomes the low level whenever one or more of the signals supplied from the AND gate 112 and the D-type flip-flops 113,116 becomes the low level. The signal C2 becomes the low level when either the signal $\overline{NM}$ or the signal B2 becomes the low level. While the signal D2 is at the low level, the compressed data is output from the compressor circuit 40 in synchronism with the serial clock $\phi_{sc}$.

Figure 15B:
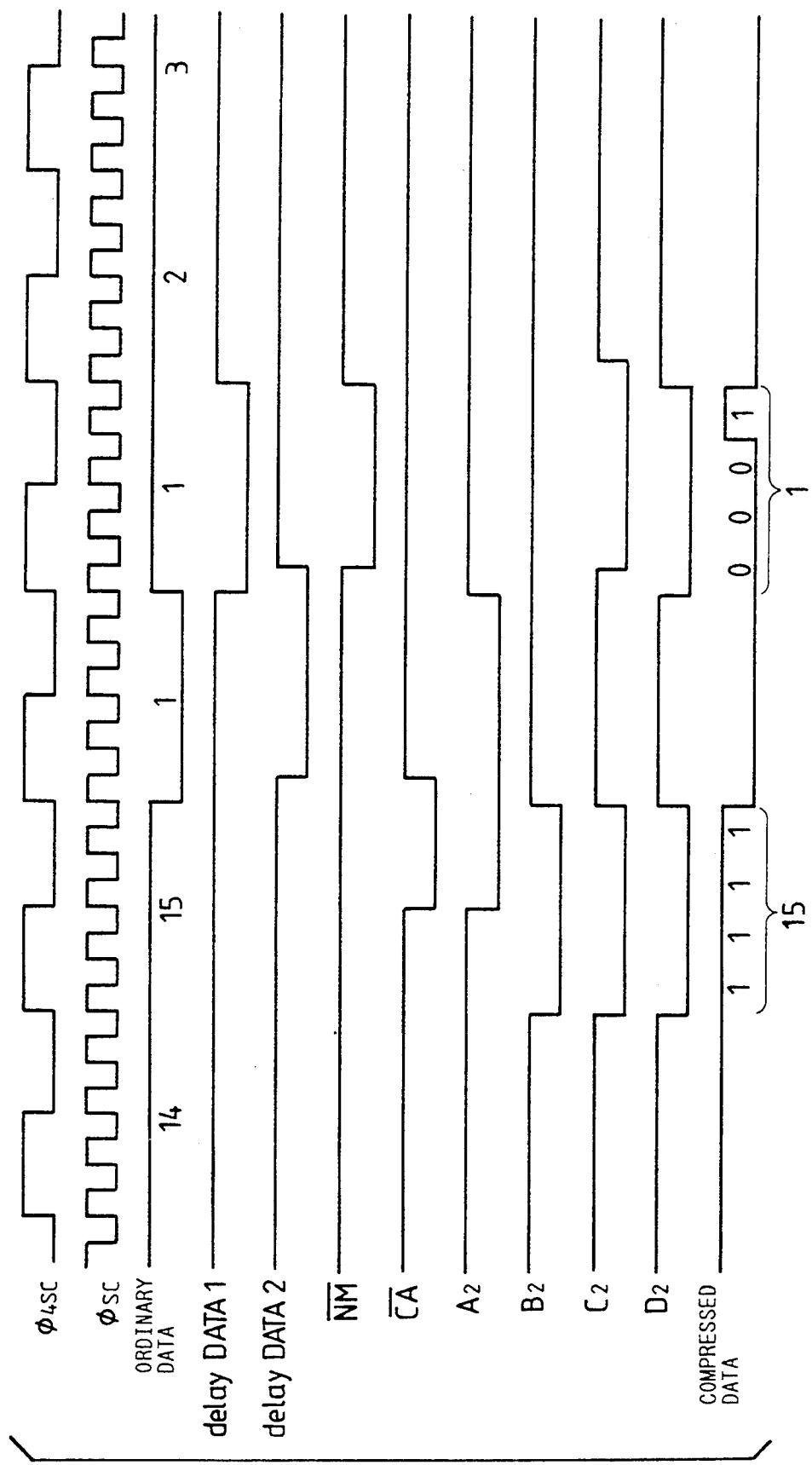

FIG. 15B shows the operation timing chart of the compressor circuit 40 in FIG. 11 in the case where the up-counter 45 has counted the ordinary data 15 items. The signals stated before shall be omitted from description.

The carry signal $\overline{CA}$ falls for a predetermined period of time when the up-counter 45 has reached a value of 15 counts. The signal A2 falls along with the carry signal $\overline{CA}$. Signal A2 then rises after a predetermined period of time since the rise of the carry signal $\overline{CA}$. As explained earlier, the compressed data is output from the compressor circuit 40 in synchronism with the serial clock $\phi_{sc}$ while the signal D2 is at the low level.

FIG. 15C shows the operation timing chart of the compressor circuit 40 in FIG. 11 where the up-counter 45 has counted the ordinary data of 16 items.

In the same manner as in FIG. 15A or 15B, the compressed data is output from the compressor circuit 40 in synchronism with the serial clock $\phi_{sc}$ while the signal D2 is at the low level. Here, the decimal number "16" cannot be expressed by a binary number of 4 bits. Therefore, "1's" are first delivered 4 successive bits so as to indicate "15". "0's" are subsequently delivered 4 successive bits so as to indicate that data exists following the data "15" previously delivered. Further, 4-bit binary data the least significant bit of which is "1" is delivered. Thus, the number "16" is indicated. In this manner, even when the long ordinary data having an identical level is supplied, it can be expressed by connecting some sets of 4-bit binary data.

Figure 16:
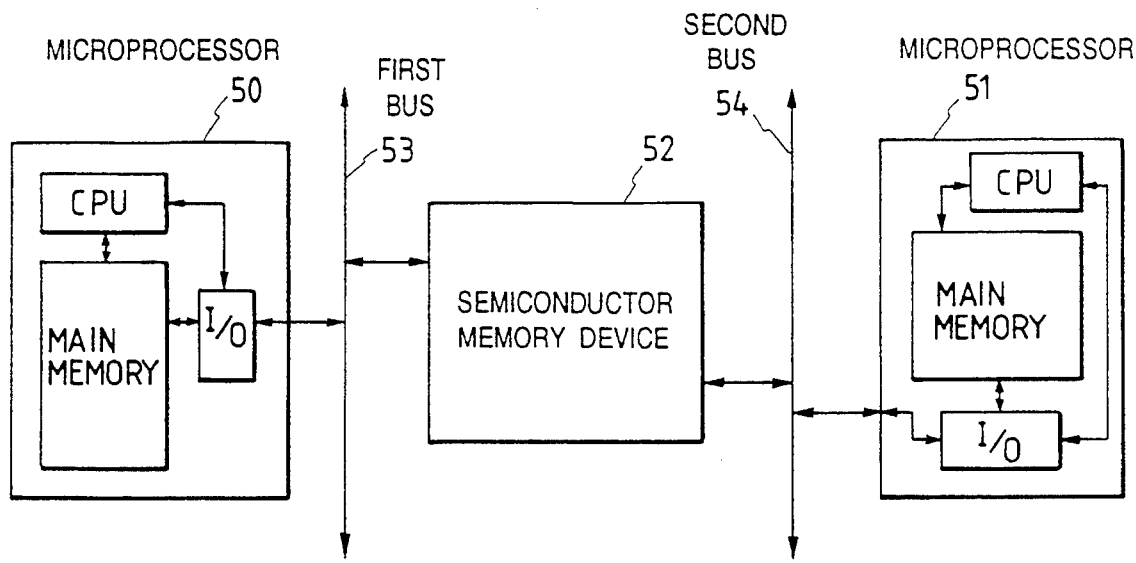
FIG. 16 is a block diagram of the architecture of an exemplary system utilizes the semiconductor memory device in FIG. 1, and, FIG. 17 is a block diagram of the architecture of another exemplary system which utilizes the semiconductor memory device in FIG. 1.

FIG. 16 shows an example of the architecture of a microcomputer system which utilizes the semiconductor memory device of this embodiment. Referring to the figure, numerals 50 and 51 denote individual microprocessors. Each of these microprocessors includes at least, a main memory, an input/output circuit I/O for transferring data from and to the other microprocessor, and a CPU for controlling the interior of the microprocessor itself. Numeral 52 denotes the semiconductor memory device of this embodiment. On this occasion, the semiconductor memory device 52 of this embodiment has the random access port 13 coupled to the microprocessor 50 through first bus means 53 and has the second serial-data external terminal $D_{s2}$ coupled to the microprocessor 51 through second bus means 54. In the example of the microcomputer system architecture, the semiconductor memory device 52 of this embodiment functions in bus-interface fashion. Since data to be transferred to the microprocessor 51 is the compressed data, the number of transfer data items decreases. However, when the data transfer rates between the microprocessor 50 and the semiconductor memory device 52, and between the microprocessor 51 and the semiconductor memory device 52 are equalized, an idle time arises in the second bus means 54 between the microprocessor 51 and the semiconductor memory device 52. Therefore, the microprocessor 51 utilizes the empty second bus means 54 and performs data transfer with another microprocessor not shown. Thus, the throughput of the whole microcomputer system is enhanced.

Figure 17:
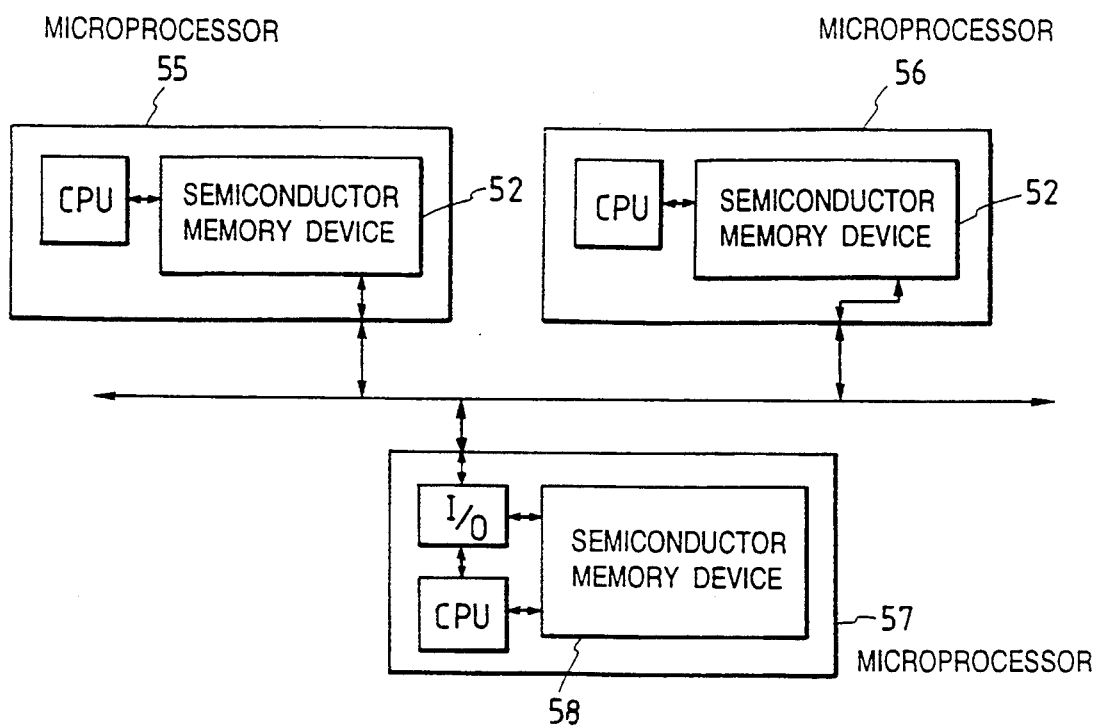

FIG. 17 shows another example of the architecture of a microcomputer system which utilizes the semiconductor memory device of this embodiment. Referring to the figure, numerals 55–57 indicate individual microprocessors. A CPU and the semiconductor memory device 52 of this embodiment are included especially in each of the microprocessors 55 and 56. The semiconductor memory device 52 has its operation controlled by the CPU. The other microprocessor 57 includes: an input/output circuit I/O for transferring data from and to a different system; a semiconductor memory device 58 different from the semiconductor memory device 52; and a CPU for controlling the interior of the microprocessor itself 57. On this occasion, the microprocessors 55 and 56 are connected through the second serial input/output circuits 22 of the semiconductor memory devices 52. In such an architecture, data can be transmitted with the compressed data between both the microprocessors 55 and 56, so that the data transmission time can be shortened. Moreover, where the operation modes of FIGS. 8A, 8B, 9A, and 9B are set in the semiconductor memory devices 52 included in both microprocessors 55 and 56, data to be transferred between the two microprocessors is subjected to a kind of ciphering. This results in enhanced security for the transmitted data.

Although, in the above, the present invention has been concretely described in conjunction with embodiments, it is not restricted to the foregoing embodiments but can be variously altered within a scope not departing from the purport thereof. By way of example, it is possible to properly alter the arrangements of the random access memory unit and input/output circuit unit thus furthering the architecture of the system to which the semiconductor memory device of the present invention is applied. It is also possible to variously alter the arrangements themselves of the compressor circuit and expander circuit or the conversion logic thereof. Moreover, it is possible to properly alter the setting ways, kinds, and contents of the operation modes in the semiconductor memory device. By way of example, the circuits of the input/output circuit unit 4 may be rendered unalterable after the determination of the operation modes according to user's specifications. In another example, the CPU may set the operation modes of the input/output circuit unit 4 every read operation in such a way that the CPU manages addresses indicating the locations of the memory array storing compressed data or the addresses indicating the locations thereof storing ordinary data. Further, as to the semiconductor memory device of the embodiment, the functions of the compressor/expander circuits may be utilized without using the function of the random access memory. More specifically, in accordance with FIG. 1, data supplied from first serial-data external terminal $D_{s1}$ through the first serial input/output circuit 21 is compressed by the compressor circuit 2. Accordingly, the compressed data is passed through the second serial input/output circuit 22 and is supplied from the second serial-data external terminal $D_{s2}$ to another system without being stored. Contrariwise, compressed data applied through the second serial input/output circuit 22 from the second serial-data external terminal $D_{s2}$ is expanded by the expander circuit 3, whereupon the resulting data is passed through the first serial input/output circuit 21 and is supplied from the first serial data external terminal $D_{s1}$ to another system without being stored. Besides, a selector circuit which is similar in function to the selector circuit 23 may well be added so as to construct a common external terminal which is coupled to the first and second serial input/output circuits 21, 22. Although the compressor circuit 2 in FIG. 2 has been applied to the aspects of performance in FIGS. 5A–5F, FIGS. 8A–8B, FIGS. 9A–9B, and FIG. 10, it can be replaced with the compressor circuit 40 in FIG. 11.

In the above, the invention made by the inventor has been chiefly described based on applications dedicated to the buffer memory for communications data and the field of utilization thereof. However, the present invention is not restricted thereto, but is extensively applicable to various semiconductor memory devices such as a general-purpose storage area for data.

Effects which are attained by typical aspects of performance of the present invention, are briefly explained as follows:

A semiconductor memory device is constructed comprising an input/output circuit unit which includes a data compressor circuit and a data expander circuit each being connected to at least one port in a random access memory unit having multiple ports, and control means for controlling them. This brings forth the effect that the temporary storage of data and the compression/expansion processes thereof can be endowed with continuities, whereby the compression/expansion processes can be executed for the temporarily stored data at high speed without burdening a processor or software.

In addition, the device has the operation mode of compressing the data read out of the random access memory unit and then serially outputting the compressed data to the exterior of the device, and also the operation mode of expanding the data supplied from the exterior and then writing the resulting data into the random access memory unit. Thus, in a case where the random access memory unit is utilized as an area for temporarily storing the data before compression, the transfer of the compressed data between at least one port and the exterior can be realized by a simple control.

Besides, the device includes the operation mode of expanding the data read out of the random access memory unit and then outputting the resulting data to the exterior, and also the operation mode of compressing the data supplied from the exterior and then writing the compressed data into the random access memory unit. Thus, in a case where the random access memory unit is utilized as an area for temporarily storing the compressed data, the transfer of the ordinary data between at least one port and the exterior can be realized by a simple control.

Besides, the compressor circuit and the expander circuit are connected to the serial access port of the random access memory unit beforehand. This makes it possible to adopt a one-dimensional encoding method for the compression/expansion processes of the data.

Moreover, the other port of the random access memory unit is set as a parallel access port which can be connected to a data bus. Thus, a high versatility can be demonstrated for system operations or various system specifications required.

Further, it is made possible to select an operation mode in which the data read out of the serial access port of the random access memory unit is serially output directly. Thus, the semiconductor memory device of the present invention can be readily diverted as a picture displaying frame buffer memory or a video RAM having hitherto been used, and the uses thereof can be increased.

What is claimed is:

1. A microcomputer system including:
   a first microprocessor coupled to a first bus means for communicating ordinary data and compressed data, the first microprocessor including a first memory means for storing the ordinary data and the compressed data, a first data transfer means for transferring the ordinary data and the compressed data between the first memory means and the first bus means, and a first central processor for controlling the first memory means and the first data transfer means;
   a second microprocessor coupled to a second bus means for communicating the ordinary data and the compressed data, the second microprocessor including a second memory means for storing ordinary data and the compressed data, a second data transfer means for transferring the ordinary data and the compressed data between the second memory means and the second bus means, and a second central processor for controlling the second memory means and the second data transfer means; and,
   a semiconductor memory device which is coupled to the first bus means and to the second bus means, said semiconductor memory device including:
     a random access memory unit including i) a memory array configured of a plurality of memory cells for storing the ordinary data and the compressed data, and ii) an input and output means coupled to the memory array and said first bus means;
     a first circuit unit including a first serial input and output means coupled to the memory array, a second serial input and output means coupled to the memory array and the second bus means, a compression means, coupled to the first serial input and output means to the second serial input and output means, for generating the compressed data, and an expansion means, coupled to the first serial input and output means and to the second serial input and output means, for generating the ordinary data from the compressed data; and
     control means for controlling operations of the random access memory unit and the first circuit unit wherein both the compressed data and the ordinary data are stored in the random access memory unit after communication through the first circuit unit.

2. The microcomputer system according to claim 1, wherein the first serial input and output means includes means for supplying the compression means with one of the compressed data and the ordinary data supplied from the memory army.

3. The microcomputer system according to claim 2, wherein the second serial input and output means includes means for selectively supplying the expansion means and the second bus means with the compressed data supplied from the memory array.

4. The microcomputer system according to claim 3, wherein the second serial input and output means includes means for selectively supplying the expansion means and the memory array with the compressed data supplied from the second bus means.

5. The microcomputer system according to claim 4, further comprising switching means for selectively coupling the first serial input and output means and the second serial input and output means with the memory array.

6. The microcomputer system according to claim 5, wherein the compression means includes means for first compressing the ordinary data supplied from the first serial input and output means and then supplying said second serial input and output means with the compressed data.

7. The microcomputer system according to claim 6, wherein the expansion means includes means for expanding the compressed data supplied from the second serial input and output means and then supplying the first serial input and output means with the ordinary data.

8. The microcomputer system according to claim 7, wherein the first serial input and output means includes means for selectively supplying the compression means and the memory array with the ordinary data supplied from the expansion means.

9. The microcomputer system according to claim 1, wherein an each of the plurality of memory cells of the memory array is a dynamic memory cell which includes an address selecting switch and an information storing capacitor.

10. A selective communication control device for communication of data including selectively expanded data and compressed data with a random access memory unit, the communication control device including a controller and a first circuit unit being formed on a single semiconductor substrate with the random access memory unit, wherein:
the first circuit unit comprises:
compressor circuit means for compressing the expanded data to form the compressed data;
expander circuit means for expanding the compressed data to form the expanded data;
a first external data terminal for communicating the expanded data with the control device;
a second external data terminal for communicating the compressed data with the control device;
first serial input and output circuit means for selectively communicating the expanded data to the compressor circuit means, to the random access memory unit, and to the first external data terminal;
second serial input and output circuit means for selectively communicating the compressed data to the expander circuit means, to the random access memory unit, and to the second external data terminal; and,
the controller comprises:
means for selectively controlling a data communication path means through the first circuit unit for selective communication of the expanded data and the compressed data to the random access memory unit and to the first and second external data terminals, wherein the data communication path means comprises means for selectively communicating 1) the expanded data from the first external data terminal, through the first serial input and output circuit means to storage in the random access memory unit, and 2) the compressed data from the second external data terminal, through the second serial input and output circuit means and the expander circuit means to storage in the random access memory unit as the expanded data.

11. The selective communication control device according to claim 10, wherein the first circuit unit further comprises selection circuit means for switching data communication paths relative to the first and second serial input and output circuit means and the random access memory unit.

12. A semiconductor memory device formed on a single semiconductor substrate including a random access memory unit and a first circuit unit, the semiconductor memory device comprising:
a plurality of exterior terminals for communicating compressed data and ordinary data to the random access memory unit and to the first circuit unit;
a first exterior terminal for communicating ordinary data to the random access memory unit and to the first input/output circuit unit;
a second exterior terminal for communicating compressed data to the first circuit unit;
control means for controlling operations of the random access memory unit and the first circuit unit in accordance with control signals wherein the compressed and ordinary data are stored in the random access memory unit after communication through the first circuit unit;
a plurality of control signal terminals for communicating the control signals to the control means;
the random access memory unit including:
an input and output means coupled to the plurality of exterior terminals and to the first circuit unit for transmitting the ordinary data and the compressed data; and
a memory array configured of a plurality of memory cells and coupled to the input and output means and to the first circuit unit, for storing the ordinary data and the compressed data;
the first circuit unit including:
a first input and output means, coupled to the memory array and to the first exterior terminal, for data communication;
a second input and output means coupled to the memory array and to the second exterior terminal for data communication;
compression means coupled to the first input and output means and to the second input and output means for expanding the compressed data into the ordinary data.

13. A semiconductor memory device formed on a single semiconductor substrate and having a plurality of control signal terminals for communicating control signals into the device, and an external terminal for communicating expanded data to and from the device, the semiconductor memory device comprising:
a plurality of data terminals for selectively communicating expanded data and compressed data to and from the device in response to predetermined ones of the control signals;
a random access memory unit including i) a memory array configured of a plurality of memory cells for storing the expanded data and the compressed data, and ii) a memory unit input and output means, coupling the memory array to ones of the plurality of data terminals, for communicating the expanded data and the compressed data to and from the random access memory unit;

a first circuits including:
  a first input and output means, coupled to the memory array and to the external terminal, for supplying expanded data to and from the device,
  a second input and output means, coupled to the memory array, for supplying compressed data to and from the device,
  a compression means, coupled to the first input and output means and to the second input and output means, for generating the compressed data, and
  an expansion means, coupled to the first input and output means and to the second input and output means, for generating the expanded data: and control means, coupled to the control signal terminals, for controlling operations of the random access memory unit and the first circuit unit in accordance with the control signals wherein both the compressed data and the expanded data are stored in the random access memory unit after communication through the first circuit unit.

14. The semiconductor memory device according to claim 13, wherein the first input and output means includes means for selectively supplying the compression means and the external terminal with the expanded data stored in the memory array.

15. The semiconductor memory device according to claim 14, wherein the second input and output means includes means for supplying the expansion means with the compressed data stored in the memory array.

16. The semiconductor memory device according to claim 15, wherein the first input and output means includes means for selectively supplying the compression means and the memory array with the expanded data communicated by the external terminal.

17. The semiconductor memory device according to claim 16, wherein the second input and output means includes means for selectively supplying the expansion means and the memory array with the compressed data generated by the compression means.

18. The semiconductor memory device according to claim 17, wherein the compression means includes means for compressing the expanded data supplied from the first input and output means and then supplying the second input and output means with the compressed data.

19. The semiconductor memory device according to claim 18, wherein the expansion means includes means for expanding the compressed data supplied from the second input and output means and then supplying the first input and output means with the expanded data.

20. The semiconductor memory device according to claim 19, further comprising switching means for selectively coupling the first and second input and output means with the memory array.

21. The semiconductor memory device according to claim 13, wherein an each of the plurality of memory cells of the memory array is a dynamic memory cell which includes an address selecting transistor and an information storing capacitor.

22. A semiconductor memory device formed on a single semiconductor substrate and having a plurality of control signal terminals for communicating control signals into the device and an external terminal for communicating comprised data to and from the device, the semiconductor memory device comprising:

a plurality of exterior terminals for communicating expanded data and compressed data to and from the device;

a random access memory unit including i) a memory array configured of a plurality of memory cells for storing the compressed data and the expanded data, and ii) a memory unit input and output means coupling the memory array to the plurality of exterior terminals;

a first circuit unit including a first input and output means coupled to thee memory array, a second input and output means coupling the memory array to the external terminal, a compression means, coupled to the first input and output means and to the second input and output means, for generating the compressed data, and an expansion means, coupled to the first input and output means and to the second input and output means, for generating the expanded data; and, control means coupled to the control signal terminals, for controlling operations of the random access memory unit and the first circuit unit in accordance with the control signals communicated into the device, wherein the compressed data is read into the semiconductor memory device through the external terminal, communicated through the second input and output means to the expansion means for expanding to the compressed data, and the expanded data is then communicated from the expansion means through the first input and output means and stored in the random access memory unit.

23. The semiconductor memory device according to claim 22, wherein the first input and output means includes means for supplying the compression means with a one of the expanded data and the compressed data stored in the memory array.

24. The semiconductor memory device according to claim 23, wherein the second input and output means includes means for selectively supplying the expansion means and the external terminal with the compressed data stored in the memory array.

25. The semiconductor memory device according to claim 24, wherein the first input and output means includes means for selectively supplying the compression means and the memory array with the expanded data generated by the expansion means.

26. The semiconductor memory device according to claim 25, wherein the second input and output means includes means for supplying the expansion means and the memory array with the compressed data read into the semiconductor memory device through the external terminal.

27. The semiconductor memory device according to claim 26, wherein the compression means includes means for compressing the expanded data supplied from the first input and output means and then supplying the second input and output means with the compressed data.

28. The semiconductor memory device according to claim 27, wherein the expansion means includes means for expanding the compressed data supplied from the second input and output means and then supplying the first input and output means with the expanded data.

29. The semiconductor memory device according to claim 28, further comprising switching means for selectively coupling the first input and output means and the second input and output means with the memory array.

30. The semiconductor memory device according to claim 22, wherein each of the plurality of memory cells of the random access memory unit is a dynamic memory cell which includes an address selecting transistor and an information storing capacitor.

31. A semiconductor memory device formed on a single semiconductor substrate and having a plurality of control signal terminals for communicating control signals into the device, a first external terminal for communicating ordinary data to and from the device, and a second external terminal for communicating compressed data to and from the device, the semiconductor memory device comprising:

a random access memory unit including i) a memory array configured of a plurality of memory cells for storing the ordinary data and the compressed data, and ii) a memory unit input and output means coupling the memory array to the first and second external terminals;

a first circuit unit including a first input and output means coupling the memory array and the first external terminal, a second input and output means coupling the memory array and the second external terminal, a compression means, coupling the first input and output means to the second input and output means, for generating the compressed data, and an expansion means coupling the lust input and output means to the second input and output means, for generating the ordinary data from the compressed data; and, control means coupled to the control signal terminals, for controlling operations of the random access memory unit and the first circuit unit in accordance with the control signals communicated into the device, wherein the control means comprises means for supplying the ordinary data from the first external terminal through the first input and output means for storage directly into the random access memory unit as the ordinary data.

32. The semiconductor memory device according to claim 31, wherein the first input and output means includes means for selectively supplying the compression means and the first external terminal with the ordinary data supplied from the memory array.

33. The semiconductor memory device according to claim 32, wherein the second input and output means includes means for selectively supplying the expansion means and the second external terminal with the compressed data supplied from the memory array.

34. The semiconductor memory device according to claim 33, wherein the first input and output means includes means for selectively supplying the compression means and the memory array with the ordinary data supplied from the first external terminal.

35. The semiconductor memory device according to claim 34, wherein the second input and output means includes means for selectively supplying the expansion means and the memory array with the compressed data supplied from the second external terminal.

36. The semiconductor memory device according to claim 35, wherein the compression means includes means for compressing the ordinary data supplied from the first input and output means and then supplying the second input and output means with the compressed data.

37. The semiconductor memory device according to claim 36, wherein the expansion means includes means for expanding the compressed data supplied from the second input and output means and then supplying the first input and output means with the ordinary data.

38. The semiconductor memory device according to claim 37, further comprising switching means for selectively coupling the first input and output means and the second input and output means with the memory array.

39. The semiconductor memory device according to claim 31, wherein an each of the plurality of memory cells is a dynamic memory cell which includes an address selecting transistor and an information storing capacitor.

40. A microcomputer system including:

a first microprocessor including a first semiconductor memory device coupled to a bus means, and a first central processor for controlling the first semiconductor memory device; and, a second microprocessor including a second semiconductor memory device coupled to the bus means, and a second central processor for controlling the second semiconductor memory device;

the first and second semiconductor memory devices being included respectively in the first and second microprocessors, each of the first and second semiconductor memory devices including:

a memory array formed of a plurality of memory cells for storing data including expanded data compressed data;

a first circuit unit having a first input and output means coupled to the memory array and to the bus means, a second input and output means coupled to the memory array and the bus means, a compression means, coupled to the first input and output means and to the second input and output means, for generating the compressed data, and an expansion means, coupled to the first input and output means and to the second input and output means, for generating the expanded data; and control means coupled to the first central processor and to the second central processor, for controlling operation of the first circuit unit in accordance with control signals supplied from the first central processor and the second central processor wherein both the compressed data and the expanded data is stored in the memory array after communication through the first circuit unit.

41. The microcomputer system according to claim 40, wherein the first input and output means includes means for selectively supplying the compression means and the bus means with a one of the compressed data and expanded data supplied from the memory array.

42. The microcomputer system according to claim 40, wherein the second input and output means includes means for selectively supplying the expansion means and the bus means with the compressed data supplied from the memory array.

43. The microcomputer system according to claim 42, wherein the first input and output means includes means for selectively supplying the compression means and the memory array with the expanded data supplied from the bus means.

44. The microcomputer system according to claim 43, wherein the second input and output means includes means for selectively supplying the expansion means and the memory array with the compressed data supplied from the bus means.

45. The microcomputer system according to claim 44, wherein the compression means includes means for compressing the expanded data supplied from the first input and output means and then supplying the second input and output means with the compressed data.

46. The microcomputer system according to claim 45, wherein the expansion means includes means for expanding the compressed data supplied from the second input and output means as first expanded data and then supplying the first input and output means with the first expanded data.

47. The microcomputer system according to claim 46, further comprising switching means for selectively coupling the first input and output means and the second input and output means with memory array.

48. The microcomputer system according to claim 40, wherein an each of the plurality of memory cells of the memory array is a dynamic memory cell which includes and address selecting MOSFET and an information storing capacitor.

* * * * *

UNITED STATES PATENT AND TRADEMARK OFFICE
CERTIFICATE OF CORRECTION

PATENT NO. : 5,440,718
DATED : August 8, 1995
INVENTOR(S) : Takehiko Kumagai, et al.

It is certified that error appears in the above-indentified patent and that said Letters Patent is hereby corrected as shown below:

Claim 1, column 14, line 27, after "storing" insert --the--.

Claim 12, column 16, line 54, after "means for" insert --compressing the ordinary data into the compressed data; and expansion means coupled to the first input and output means and to the second input and output means for--.

Claim 13, column 17, line 6, after "first" delete "circuits" and substitute therefor --circuit--.

Claim 22, column 18, line 13, after "coupled to" delete "thee" and substitute therefor --the--.

Claim 31, column 19, line 29, after "coupling the" delete "lust" and substitute therefor --first--.

Claim 42, column 20, line 57, delete "40" and substitute therefor --41--.

Signed and Sealed this

Tenth Day of October, 1995

*Attest:*

BRUCE LEHMAN

*Attesting Officer*   Commissioner of Patents and Trademarks